(12) United States Patent
Watanabe

(10) Patent No.: US 12,506,124 B2
(45) Date of Patent: Dec. 23, 2025

(54) RADIO-FREQUENCY MODULE

(71) Applicant: Murata Manufacturing Co., Ltd., Kyoto (JP)

(72) Inventor: Takashi Watanabe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 357 days.

(21) Appl. No.: 18/298,421

(22) Filed: Apr. 11, 2023

(65) Prior Publication Data

US 2023/0246009 A1   Aug. 3, 2023

Related U.S. Application Data

(63) Continuation of application No. PCT/JP2021/038695, filed on Oct. 20, 2021.

(30) Foreign Application Priority Data

Oct. 30, 2020   (JP) .................. 2020-182499

(51) Int. Cl.
   *H03F 3/19* (2006.01)
   *H01L 25/16* (2023.01)
   *H01L 23/538* (2006.01)

(52) U.S. Cl.
   CPC ............ *H01L 25/16* (2013.01); *H03F 3/19* (2013.01); *H01L 23/5381* (2013.01); *H03F 2200/165* (2013.01); *H03F 2200/294* (2013.01); *H03F 2200/451* (2013.01)

(58) Field of Classification Search
   CPC .... H03F 3/19; H04B 1/38; H04B 1/00; H04B 1/40
   See application file for complete search history.

(56) References Cited

U.S. PATENT DOCUMENTS

| | | |
|---|---|---|
| 2010/0157858 A1 | 6/2010 | Lee et al. |
| 2020/0204159 A1 | 6/2020 | Onodera et al. |
| 2020/0228151 A1 | 7/2020 | Naniwa et al. |
| 2020/0235772 A1 | 7/2020 | Naniwa |

(Continued)

FOREIGN PATENT DOCUMENTS

| | | |
|---|---|---|
| JP | 2007-251508 A | 9/2007 |
| JP | 2012-054635 A | 3/2012 |
| JP | 2012-514387 A | 6/2012 |

(Continued)

OTHER PUBLICATIONS

International Search Report for PCT/JP2021/038695 dated Dec. 21, 2021.

*Primary Examiner* — Ayodeji O Ayotunde
(74) *Attorney, Agent, or Firm* — McDonald Hopkins LLC

(57) ABSTRACT

A radio-frequency module includes: a filter for band A; a filter for band B; a filter for band C; a filter for band D; a switch having a terminal connected to an antenna connection terminal, a terminal connected to the filters, and a terminal connected to the filters; low-noise amplifiers respectively connected to the filters; and low-noise amplifiers respectively connected to the filters. The filters are included in one integrated circuit disposed on a main surface of a module substrate. The filters are included in one integrated circuit disposed on the main surface. The integrated circuit and the low-noise amplifiers at least partially overlap in plan view.

18 Claims, 7 Drawing Sheets

(56) References Cited

U.S. PATENT DOCUMENTS

2020/0251459 A1* 8/2020 Tsuda ................. H01L 23/66

FOREIGN PATENT DOCUMENTS

| JP | 2020-102758 A | 7/2020 |
| JP | 2020-120185 A | 8/2020 |
| JP | 2020-126921 A | 8/2020 |
| WO | 2019/065311 A1 | 4/2019 |

* cited by examiner

RADIO-FREQUENCY MODULE

CROSS REFERENCE TO RELATED APPLICATION

This is a continuation of International Application No. PCT/JP2021/038695 filed on Oct. 20, 2021 which claims priority from Japanese Patent Application No. 2020-182499 filed on Oct. 30, 2020. The contents of these applications are incorporated herein by reference in their entireties.

BACKGROUND ART

Technical Field

The present disclosure relates to radio-frequency modules.

In mobile communication devices such as mobile phones, the arrangement configurations of circuit elements forming radio-frequency front end circuits have been becoming increasingly complex, particularly with the development of multi-band technologies.

Patent Document 1 discloses a front-end module including a switch unit, a filter unit, a matching network, and an amplification unit. In this front-end module, the switch unit, the filter unit, and the matching network are disposed on a front surface of a substrate and the amplification unit is disposed on the rear surface of the substrate.

Patent Document 1: International Publication No. 2019/065311

BRIEF SUMMARY

However, in the above technologies of the related art, the electrical characteristics of the module (for example, noise figure (NF) and amplification characteristics) may be degraded.

Accordingly, the present disclosure provides a radio-frequency module that is able to realize improved electrical characteristics.

A radio-frequency module according to an aspect of the present disclosure includes: a first filter having a pass band including at least part of a first band; a second filter having a pass band including at least part of a second band; a third filter having a pass band including at least part of a third band; a fourth filter having a pass band including at least part of a fourth band; a switch having a first terminal connected to an antenna connection terminal, a second terminal connected to an input terminal of the first filter and an input terminal of the second filter, and a third terminal connected to an input terminal of the third filter and an input terminal of the fourth filter; at least one first amplifier connected to an output terminal of the first filter and an output terminal of the third filter; at least one second amplifier connected to an output terminal of the second filter and an output terminal of the fourth filter; and a module substrate having a first main surface and a second main surface, which face each other. The first filter and the third filter are included in one first integrated circuit disposed on the first main surface. The second filter and the fourth filter are included in one second integrated circuit disposed on the first main surface. The at least one first amplifier is disposed on the second main surface. The first integrated circuit and the at least one first amplifier at least partially overlap in plan view.

The radio-frequency module according to the aspect of the present disclosure is able to realize improved electrical characteristics.

DETAILED DESCRIPTION

Figure 1:
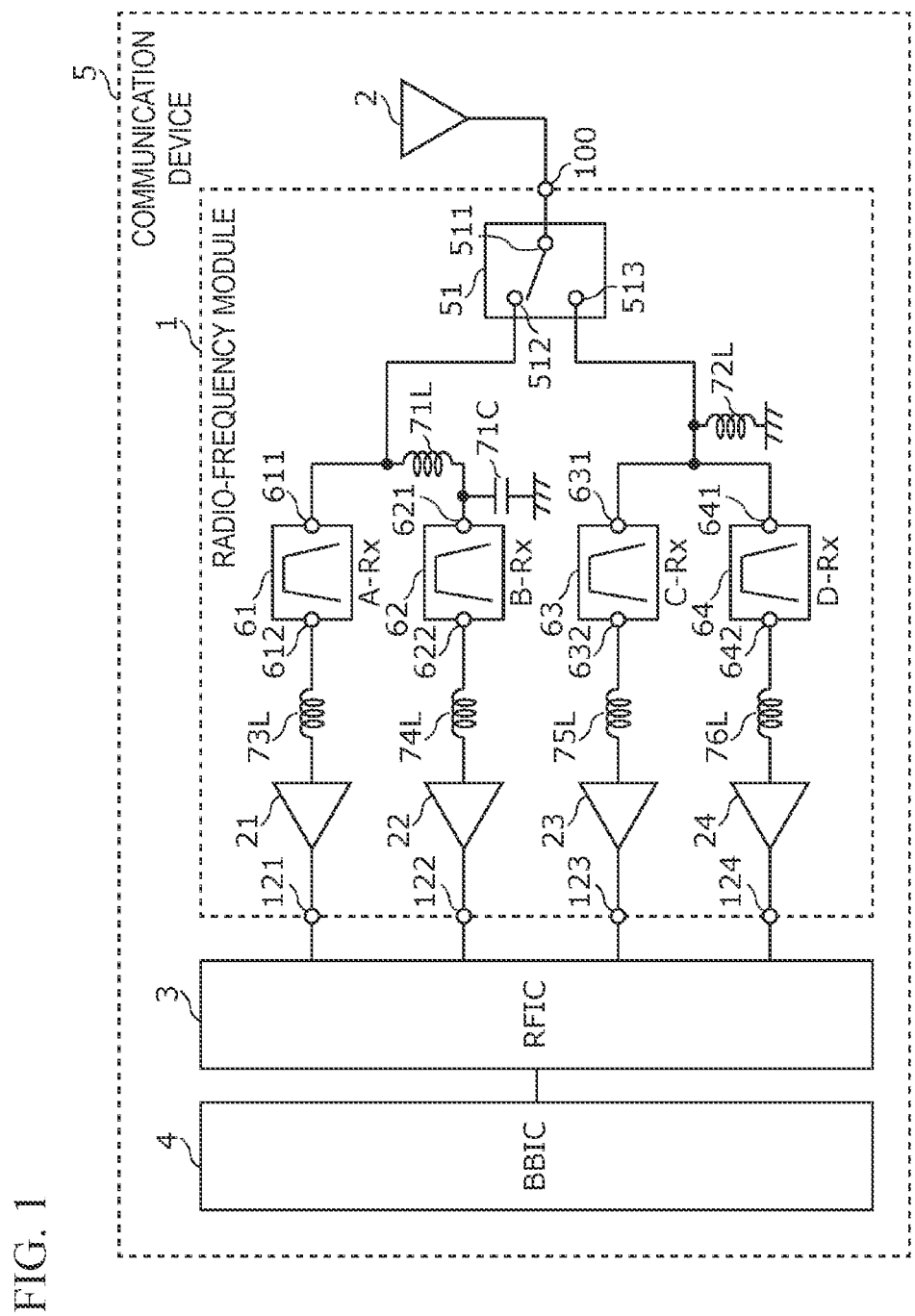
FIG. 1 is a circuit configuration diagram of a radio-frequency module and a communication device according to Embodiment 1.

Hereafter, embodiments of the present disclosure will be described in detail using the drawings. The embodiments described hereafter each illustrates a comprehensive or specific example of the present disclosure. The numerical values, shapes, materials, constituent elements, arrangements of the constituent elements, the ways in which the constituent elements are connected, and so forth described in the following embodiments are merely examples and are not intended to limit the present disclosure.

The drawings are schematic diagrams in which certain elements are emphasized or omitted or their proportions are adjusted as appropriate in order to illustrate the present disclosure, the drawings are not necessarily illustrated in a strictly accurate manner, and the actual shapes, positional relationships, and proportions may be different. In the drawings, configurations that are substantially the same as each other may be denoted by the same symbols and repeated description thereof may be omitted or simplified.

In the drawings referred to below, an x axis and a y axis are axes that are perpendicular to each other on a plane that is parallel to main surfaces of a module substrate. Specifically, when the module substrate has a rectangular shape in plan view, the x-axis is parallel to a first edge of the module substrate and the y-axis is parallel to a second edge of the module substrate that is perpendicular to the first edge. In addition, a z axis is an axis that is perpendicular to the main surfaces of the module substrate, and a positive z axis direction indicates an upward direction and a negative z axis direction indicates a downward direction.

In the circuit configuration of the present disclosure, the meaning of "connected" includes not only direct connections with connection terminals and/or wiring conductors, but also electrical connections realized via other circuit elements. Furthermore, "connected between A and B" means connected to both A and B between A and B.

In the arrangement of components in the present disclosure, "plan view" refers to objects being viewed from the positive z-axis side as orthographic projections onto the xy-plane. "A is disposed between B and C in plan view" means that at least one out of a plurality of line segments connecting any point within the area of B projected onto the xy-plane and any point within the area of C projected onto the xy-plane passes through the area of A projected onto the xy-plane. In addition, terms indicating the relationships between elements, such as "parallel" and "perpendicular", terms indicating the shape of elements such as "rectangular", and numerical ranges do not express only a strict meaning, but rather are intended to include substantially equivalent ranges, for example, differences of several percent.

In addition, the meaning of "a component is disposed on a substrate" includes not only a case in which the component is disposed on the substrate so as to be in contact with the substrate, but also a case in which the component is disposed above the substrate without necessarily contacting the substrate (for example, the component is stacked on another component stacked on the substrate) and a case in which the component is disposed so as to be partially or entirely embedded within the substrate. In addition, the meaning of "a component is disposed on a main surface of a substrate" includes not only a case in which the component is disposed on the main surface so as to be in contact with the main surface of the substrate, but also a case in which the component is disposed above the main surface without necessarily contacting the main surface and a case in which the component is disposed so as to be partially embedded within the substrate from the main surface.

Embodiment 1

[1.1 Circuit Configurations of Radio-Frequency Module 1 and Communication Device 5]

First, the circuit configurations of a radio-frequency module 1 and a communication device 5 including the radio-frequency module 1 according to this embodiment will be described while referring to FIG. 1. FIG. 1 is a circuit configuration diagram of the radio-frequency module 1 and the communication device 5 according to Embodiment 1.

[1.1.1 Circuit Configuration of Communication Device 5]

As illustrated in FIG. 1, the communication device 5 according to this embodiment includes the radio-frequency module 1, an antenna 2, a radio frequency integrated circuit (RFIC) 3, and a baseband integrated circuit (BBIC) 4.

The radio-frequency module 1 transmits radio-frequency signals between the antenna 2 and the RFIC 3. The internal configuration of the radio-frequency module 1 will be described later.

The antenna 2 is connected to an antenna connection terminal 100 of the radio-frequency module 1. The antenna 2 receives a radio-frequency signal from the outside and outputs the received radio-frequency signal to the radio-frequency module 1.

The RFIC 3 is an example of a signal processing circuit that processes radio-frequency signals.

Specifically, the RFIC 3 subjects a radio-frequency reception signal input thereto via a reception path of the radio-frequency module 1 to signal processing using down conversion and so forth and outputs a reception signal generated through this signal processing to the BBIC 4. In addition, the RFIC 3 includes a control unit that controls switches, amplifiers, and so forth of the radio-frequency module 1. Some or all of the functions of the control unit of the RFIC 3 may be implemented outside the RFIC 3, for example, in the BBIC 4 or the radio-frequency module 1.

The BBIC 4 is a base band signal processing circuit that performs signal processing using an intermediate frequency band located at a lower frequency than radio-frequency signals transmitted by the radio-frequency module 1. A signal processed by the BBIC 4 is used as an image signal for image display and/or as an audio signal for a telephone call via a speaker, for example.

The antenna 2 and the BBIC 4 are optional constituent elements of the communication device 5 according to this embodiment.

[1.1.2 Circuit Configuration of Radio-Frequency Module 1]

Next, the circuit configuration of the radio-frequency module 1 will be described. As illustrated in FIG. 1, the radio-frequency module 1 includes low-noise amplifiers 21 to 24, a switch 51, filters 61 to 64, a capacitor 71C, inductors 71L to 76L, the antenna connection terminal 100, and radio-frequency output terminals 121 to 124.

The antenna connection terminal 100 is connected to the antenna 2 outside the radio-frequency module 1.

The radio-frequency output terminals 121 to 124 are terminals for supplying radio-frequency reception signals to outside the radio-frequency module 1. In this embodiment, the radio-frequency output terminals 121 to 124 are connected to the RFIC 3 outside the radio-frequency module 1.

The low-noise amplifier 21 is an example of at least one first amplifier and can amplify a reception signal of band A received from the antenna connection terminal 100. The low-noise amplifier 21 is connected between the filter 61 and the radio-frequency output terminal 121.

Specifically, an input terminal of the low-noise amplifier 21 is connected to the filter 61 via the inductor 73L and an output terminal of the low-noise amplifier 21 is connected to the radio-frequency output terminal 121.

The low-noise amplifier 22 is an example of at least one second amplifier and can amplify a reception signal of band B received from the antenna connection terminal 100. The low-noise amplifier 22 is connected between the filter 62 and the radio-frequency output terminal 122.

Specifically, an input terminal of the low-noise amplifier 22 is connected to the filter 62 via the inductor 74L and an output terminal of the low-noise amplifier 22 is connected to the radio-frequency output terminal 122.

The low-noise amplifier 23 is an example of at least one first amplifier and can amplify a reception signal of band C received from the antenna connection terminal 100. The low-noise amplifier 23 is connected between the filter 63 and the radio-frequency output terminal 123.

Specifically, an input terminal of the low-noise amplifier 23 is connected to the filter 63 via the inductor 75L and an output terminal of the low-noise amplifier 23 is connected to the radio-frequency output terminal 123.

The low-noise amplifier 23 may be combined with the low-noise amplifier 21 into one low-noise amplifier. In other words, the radio-frequency module 1 does not have to include the low-noise amplifier 23. In this case, the radio-frequency module 1 may include a switch connected between the low-noise amplifier 21 and the filters 61 and 63. This switch can switch the connection between the low-noise amplifier 21 and the filters 61 and 63.

The low-noise amplifier 24 is an example of at least one second amplifier and can amplify a reception signal of band D received from the antenna connection terminal 100. The low-noise amplifier 24 is connected between the filter 64 and the radio-frequency output terminal 124.

Specifically, an input terminal of the low-noise amplifier 24 is connected to the filter 64 via the inductor 76L and an output terminal of the low-noise amplifier 24 is connected to the radio-frequency output terminal 124.

The low-noise amplifier 24 may be combined with the low-noise amplifier 22 into one low-noise amplifier. In other words, the radio-frequency module 1 does not have to include the low-noise amplifier 24. In this case, the radio-frequency module 1 may include a switch connected between the low-noise amplifier 22 and the filters 62 and 64. This switch can switch the connection between the low-noise amplifier 22 and the filters 62 and 64.

The switch 51 has terminals 511 to 513. The terminal 511 is an example of a first terminal and is connected to the antenna connection terminal 100. The terminal 512 is an example of a second terminal and is connected to an input terminal 611 of the filter 61 and an input terminal 621 of the filter 62. The terminal 513 is an example of a third terminal and is connected to an input terminal 631 of the filter 63 and an input terminal 641 of the filter 64.

In this connection configuration, the switch 51 can connect the terminal 511 to either the terminal 512 or the terminal 513 on the basis of a control signal from the RFIC 3, for example. In other words, the switch 51 can switch the connection of the antenna 2 between the pair of filters 61 and 62 and the pair of filters 63 and 64. The switch 51 is configured using a single-pole double-throw (SPDT) type switch circuit for example, and may be referred to as an antenna switch.

The filter 61 (A-Rx) is an example of a first filter and has a pass band that includes band A. The filter 61 is connected between the switch 51 and the low-noise amplifier 21. Specifically, the input terminal 611 of the filter 61 is connected to the terminal 512 of the switch 51, and an output terminal 612 of the filter 61 is connected to an input terminal of the low-noise amplifier 21 via the inductor 73L. Band A will be described later.

The filter 62 (B-Rx) is an example of a second filter and has a pass band that includes band B. The filter 62 is connected between the switch 51 and the low-noise amplifier 22. Specifically, the input terminal 621 of the filter 62 is connected to the terminal 512 of the switch 51 via the inductor 71L, and an output terminal 622 of the filter 62 is connected to an input terminal of the low-noise amplifier 22 via the inductor 74L. Band B will be described later.

The input terminal 611 of the filter 61 and the input terminal 621 of the filter 62 are both connected to the terminal 512 of the switch 51 and form a common terminal. The filters 61 and 62 may also be called a diplexer.

The filter 63 (C-Rx) is an example of a third filter and has a pass band that includes band C. The filter 63 is connected between the switch 51 and the low-noise amplifier 23. Specifically, the input terminal 631 of the filter 63 is connected to the terminal 513 of the switch 51, and an output terminal 632 of the filter 63 is connected to an input terminal of the low-noise amplifier 23 via the inductor 75L. Band C will be described later.

The filter 64 (D-Rx) is an example of a fourth filter and has a pass band that includes band D. The filter 64 is connected between the switch 51 and the low-noise amplifier 24. Specifically, the input terminal 641 of the filter 64 is connected to the terminal 513 of the switch 51, and an output terminal 642 of the filter 64 is connected to an input terminal of the low-noise amplifier 24 via the inductor 76L. Band D will be described later.

The input terminal 631 of the filter 63 and the input terminal 641 of the filter 64 are both connected to the terminal 513 of the switch 51 and form a common terminal. The filters 63 and 64 may also be called a diplexer.

The capacitor 71C is connected between the input terminal 621 of the filter 62 and the terminal 512 of the switch 51. Specifically, the capacitor 71C is connected between ground and a path connecting the input terminal 621 of the filter 62 to the terminal 512 of the switch 51. Here, the capacitor 71C is a so-called shunt capacitor.

The inductor 71L is an example of a first inductor and is connected between the input terminal 621 of the filter 62 and the terminal 512 of the switch 51. Specifically, the inductor 71L is connected in series along a path connecting the input terminal 621 of the filter 62 to the terminal 512 of the switch 51. Here, the inductor 71L is a so-called series inductor, but does not have to be a series inductor.

The capacitor 71C and the inductor 71L form an impedance matching network. The capacitor 71C and the inductor 71L can provide impedance matching between the output impedance of the switch 51 and the input impedances of the filters 61 and 62.

The inductor 72L is an example of a second inductor and is connected between the input terminal 631 of the filter 63 and the input terminal 641 of the filter 64, and the terminal 513 of the switch 51. Specifically, the inductor 72L is connected between ground and a path connecting the input terminal 631 of the filter 63 to the terminal 513 of the switch 51, and is connected between ground and a path connecting the input terminal 641 of the filter 64 to the terminal 513 of the switch 51. Here, the inductor 72L is a so-called shunt inductor, but does not have to be a shunt inductor. The inductor 72L forms an impedance matching network and can provide impedance matching between the output impedance of the switch 51 and the input impedances of the filters 63 and 64.

The inductor 73L is an example of a third inductor and is connected to the output terminal 612 of the filter 61. Specifically, the inductor 73L is connected in series along a path connecting the output terminal 612 of the filter 61 to the input terminal of the low-noise amplifier 21. Here, the inductor 73L is a so-called series inductor, but does not have to be a series inductor. The inductor 73L forms an impedance matching network and can provide impedance matching between the output impedance of the filter 61 and the input impedance of the low-noise amplifier 21.

The inductor 74L is an example of a fourth inductor and is connected to the output terminal 622 of the filter 62. Specifically, the inductor 74L is connected in series along a path connecting the output terminal 622 of the filter 62 to the input terminal of the low-noise amplifier 22. Here, the inductor 74L is a so-called series inductor, but does not have to be a series inductor. The inductor 74L forms an impedance matching network and can provide impedance matching between the output impedance of the filter 62 and the input impedance of the low-noise amplifier 22.

The inductor 75L is an example of a fifth inductor and is connected to the output terminal 632 of the filter 63. Specifically, the inductor 75L is connected in series along a path connecting the output terminal 632 of the filter 63 to the input terminal of the low-noise amplifier 23. Here, the inductor 75L is a so-called series inductor, but does not have to be a series inductor. The inductor 75L forms an impedance matching network and can provide impedance matching between the output impedance of the filter 63 and the input impedance of the low-noise amplifier 23.

The inductor 76L is an example of a sixth inductor and is connected to the output terminal 642 of the filter 64. Specifically, the inductor 76L is connected in series along a path connecting the output terminal 642 of the filter 64 to the input terminal of the low-noise amplifier 24. Here, the inductor 76L is a so-called series inductor, but does not have to be a series inductor. The inductor 76L forms an impedance matching network and can provide impedance matching between the output impedance of the filter 64 and the input impedance of the low-noise amplifier 24.

Some of the circuit elements illustrated in FIG. 1 do not have to be included in the radio-frequency module 1. For example, the radio-frequency module 1 does not have to include the capacitor 71C or the inductors 71L to 76L.

[1.2 Arrangement of Components of Radio-Frequency Module 1]

Next, an example of the arrangement of components of the radio-frequency module 1 configured as described above will be described in a specific manner while referring to FIGS. 2A, 2B, and 3.

Figure 2A:
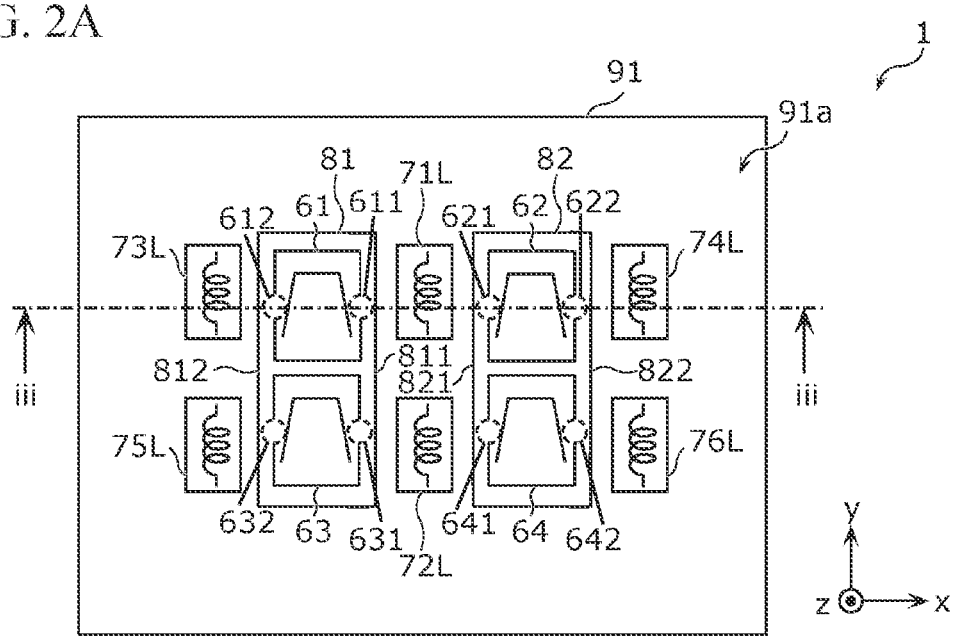
FIG. 2A is a plan view of the radio-frequency module according to Embodiment 1.

FIG. 2A is a plan view of the radio-frequency module 1 according to Embodiment 1. Specifically, FIG. 2A is a view of a main surface 91*a* of a module substrate 91 from the positive side of the z-axis. FIG. 2B is a planar see-through view of the radio-frequency module 1 according to Embodiment 1. Specifically, FIG. 2B is a see-through view of a main surface 91*b* of the module substrate 91 from the positive side of the z-axis. FIG. 3 is a sectional view of the radio-frequency module 1 according to Embodiment 1.

Figure 2B:
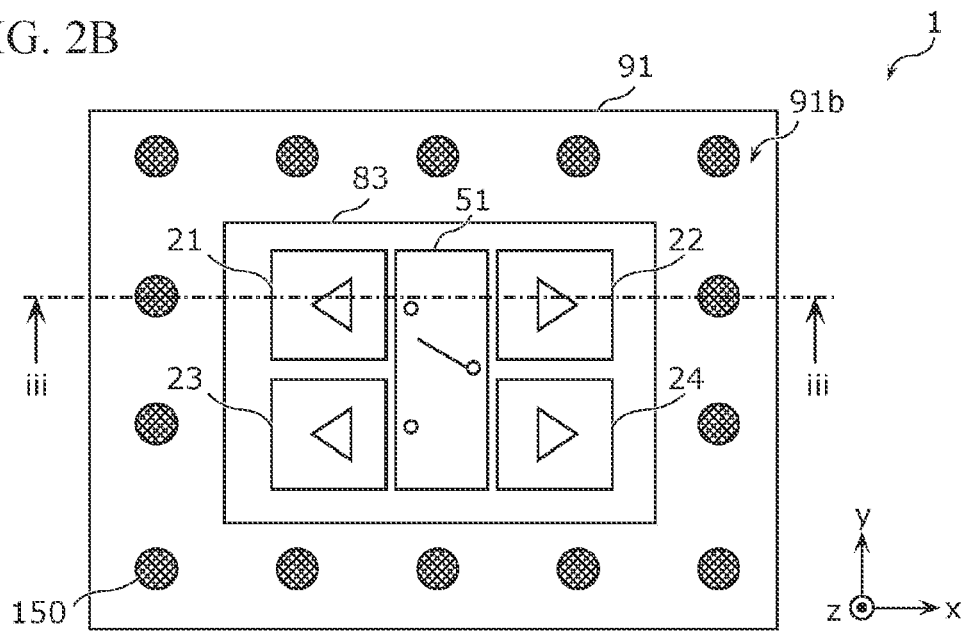
FIG. 2B is a planar see-through view of the radio-frequency module according to Embodiment 1.
Figure 3:
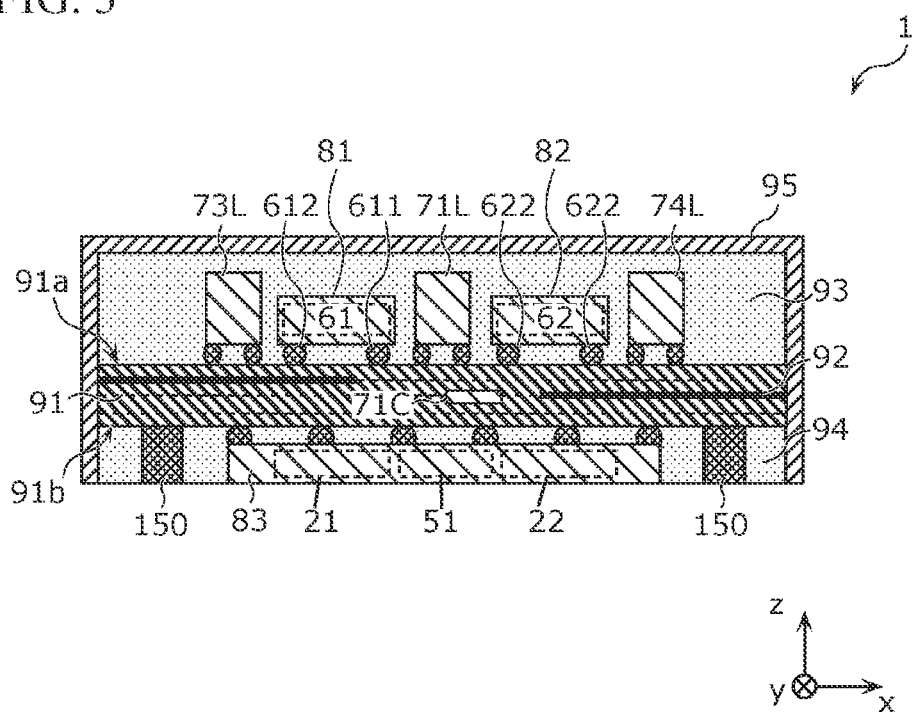
FIG. 3 is a sectional view of the radio-frequency module according to Embodiment 1.

As illustrated in FIGS. 2A, 2B, and 3, the radio-frequency module 1 includes, in addition to the circuit components including the circuit elements illustrated in FIG. 1, the module substrate 91, resin members 93 and 94, a shield electrode layer 95, and a plurality of post electrodes 150. Note that illustration of the resin members 93 and 94 and the shield electrode layer 95 is omitted from FIGS. 2A and 2B. In addition, illustration of wiring lines connecting the plurality of components disposed on or in the module substrate 91 to each other is omitted from FIGS. 2A, 2B, and 3.

The module substrate 91 has main surfaces 91*a* and 91*b*, which face each other. The main surfaces 91*a* and 91*b* are examples of a first main surface and a second main surface, respectively. In this embodiment, the module substrate 91 has a rectangular shape in plan view, but the shape of the module substrate 91 is not limited to this shape. For example, a low-temperature co-fired ceramic (LTCC) substrate or a high-temperature co-fired ceramic (HTCC) substrate having a multilayer structure consisting of a plurality of dielectric layers, a built-in-component substrate, a substrate having a redistribution layer (RDL), or a printed substrate can be used as the module substrate 91, but the module substrate 91 is not limited to these examples. The capacitor 71C is disposed and a ground electrode pattern 92 is formed inside the module substrate 91.

Here, first, the components disposed on the main surface 91*a* will be described. The main surface 91*a* is the surface of the module substrate 91 on the opposite side from the main surface 91*b* and may be referred to as a top surface or a front surface. The filters 61 to 64 and the inductors 71L to 76L are disposed on the main surface 91*a*. The main surface 91*a* and the components on the main surface 91*a* are covered by the resin member 93.

The filters 61 to 64 may be, for example, surface acoustic wave (SAW) filters, acoustic wave filters using bulk acoustic waves (BAWs), LC resonance filters, or dielectric filters, but are not limited to these kinds of filters.

The filters 61 and 63 are included in one integrated circuit 81, and the filters 62 and 64 are included in one integrated circuit 82. In other words, the filters 61 and 63 are integrated into a single chip, and the filters 62 and 64 are integrated into a single chip.

The integrated circuit 81 is a single package including the filters 61 and 63. The integrated circuit 81 has two edges 811 and 812 that face each other in plan view. The edge 811 is an example of a first edge and is the right-hand edge of the integrated circuit 81 extending along the y-axis in FIG. 2A. The edge 812 is an example of a second edge and is the left-hand edge of the integrated circuit 81 extending along the y-axis in FIG. 2A. Note that the shape of the integrated circuit 81 in FIG. 2A is merely an example and is not limited to a rectangular shape.

The filters 61 and 63 are disposed in a line along the edge 811 inside the integrated circuit 81.

Specifically, the filters 61 and 63 can be formed, for example, by arranging two piezoelectric substrates, on which functional electrodes are disposed, in the y-direction on a single semiconductor substrate along the edge 811. The structures of the filters 61 and 63 are not limited to this example.

The input terminal 611 of the filter 61 and the input terminal 631 of the filter 63 are disposed on the side of the integrated circuit 81 where the edge 811 is located. In other words, the edge 811 is nearer the input terminals 611 and 631 than the edge 812. In addition, the output terminal 612 of the filter 61 and the output terminal 632 of the filter 63 are disposed on the side of the integrated circuit 81 where the edge 812 is located. In other words, the edge 812 is nearer the output terminals 612 and 632 than the edge 811.

The integrated circuit 82 is a single package including the filters 62 and 64. The integrated circuit 82 has two edges 821 and 822 that face each other in plan view. The edge 821 is an example of a third edge and is the left-hand edge of the integrated circuit 82 extending along the y-axis in FIG. 2A. The edge 822 is an example of a fourth edge and is the right-hand edge of the integrated circuit 82 extending along the y-axis in FIG. 2A. Note that the shape of the integrated circuit 82 in FIG. 2A is merely an example and is not limited to a rectangular shape.

The filters 62 and 64 are disposed in a line along the edge 821 inside the integrated circuit 82.

Specifically, the filters 62 and 64 can be formed, for example, by arranging two piezoelectric substrates, on which functional electrodes are disposed, in the y-direction on a single semiconductor substrate along the edge 821. The structures of the filters 62 and 64 are not limited to this example.

The input terminal 621 of the filter 62 and the input terminal 641 of the filter 64 are disposed on the side of the integrated circuit 82 where the edge 821 is located. In other words, the input terminals 621 and 641 are nearer to the edge 821 than to the edge 822. In addition, the output terminal 622 of the filter 62 and the output terminal 642 of the filter 64 are disposed on the side of the integrated circuit 82 where the edge 822 is located. In other words, the output terminals 622 and 642 are nearer to the edge 822 than to the edge 821.

The integrated circuits 81 and 82 are disposed so that the edges 811 and 821 face each other in plan view. That is, in the integrated circuit 81, the edge 811 is closer to integrated circuit 82 than the edge 812, and in the integrated circuit 82, the edge 821 is closer to the integrated circuit 81 than the edge 822.

The filter 61 inside the integrated circuit 81 and the filter 62 inside the integrated circuit 82 are arrayed in the x direction perpendicular to the edge 811 in plan view. In other words, the filters 61 and 62 are disposed so that a single straight line parallel to the x-axis passes through both the filters 61 and 62 in plan view. In addition, the filter 63 inside the integrated circuit 81 and the filter 64 inside the integrated circuit 82 are arrayed in the x direction perpendicular to the edge 811 in plan view. In other words, the filters 63 and 64 are disposed so that a single straight line parallel to the x-axis passes through both the filters 63 and 64 in plan view.

Each of the inductors 71L to 76L is configured as a surface mount device (SMD), for example. The inductors 71L to 76L are not limited to SMDs. For example, the inductors 71L to 76L may be configured as integrated passive devices (IPDs).

In plan view, the inductor 71L is disposed between the filters 61 and 62, the inductor 73L is disposed at a position facing the filter 61 with the edge 812 therebetween, and the inductor 74L is disposed at a position facing the filter 62 with the edge 822 therebetween. In this case, the inductor 73L, the filter 61, the inductor 71L, the filter 62, and the inductor 74L are disposed in a row in the x direction in this order.

In addition, in plan view, the inductor 72L is disposed between the filters 63 and 64, the inductor 75L is disposed at a position facing the filter 63 with the edge 812 therebetween, and the inductor 76L is disposed at a position facing the filter 64 with the edge 822 therebetween. In this case, the inductor 75L, the filter 63, the inductor 72L, the filter 64, and the inductor 76L are disposed in a row in the x direction in this order.

Note that, in this embodiment, both the pair of filters 61 and 63 and the pair of filters 62 and 64 are respectively included in the integrated circuits 81 and 82, but one out of the pair of filters 61 and 63 and the pair of filters 62 and 64 does not have to be included in an integrated circuit. In other words, either the pair of filters 61 and 63 or the pair of filters 62 and 64 may be implemented in a separate manner.

The resin member 93 covers the main surface 91a and the components on the main surface 91a. The resin member 93 has a function of ensuring the reliability, in terms of mechanical strength, moisture resistance and so on, of the components on the main surface 91a.

Next, the components disposed on the main surface 91b will be described. The main surface 91b is the surface of the module substrate 91 on the opposite side from the main surface 91a and may be referred to as a bottom surface or a rear surface. The low-noise amplifiers 21 to 24, the switch 51, and the plurality of post electrodes 150 are disposed on the main surface 91b. The main surface 91b and the components on the main surface 91b are covered by the resin member 94.

The low-noise amplifiers 21 to 24 and the switch 51 are included in one integrated circuit 83. The integrated circuit 83 is a semiconductor integrated circuit, and is configured using complementary metal oxide semiconductor (CMOS), for example. Specifically, the integrated circuit 83 may be manufactured using a silicon on insulator (SOI) process. This allows the integrated circuit 83 to be manufactured at a low cost. The integrated circuit 83 is not limited to this configuration and may be formed using at least one out of GaAs, SiGe, and GaN. This allows the low-noise amplifiers 21-24 and the switch 51 to be realized with high quality.

The integrated circuit 83 has a rectangular shape in plan view, but the shape of the integrated circuit 83 is not limited to this shape. Within the integrated circuit 83, the low-noise amplifiers 21 and 23 are arrayed in the y-direction, and the low-noise amplifiers 22 and 24 are also arrayed in the y-direction. The low-noise amplifiers 21 and 22 face each other in the x direction with the switch 51 therebetween, and the low-noise amplifiers 23 and 24 also face each other in the x direction with the switch 51 therebetween.

The low-noise amplifiers 21 and 23 disposed on the main surface 91b overlap at least part of the integrated circuit 81 disposed on the main surface 91a in plan view. Similarly, the low-noise amplifiers 22 and 24 overlap at least part of the integrated circuit 82 in plan view. At least part of the switch 51 is disposed between the edge 811 of the integrated circuit 81 and the edge 821 of the integrated circuit 82 in plan view.

In this embodiment, the low-noise amplifiers 21 to 24 and the switch 51 are included in the single integrated circuit 83, but this configuration does not have to be adopted. For example, the low-noise amplifiers 21 to 24 and the switch 51 may be implemented separately from each other.

The plurality of post electrodes 150 includes a ground terminal in addition to the antenna connection terminal 100 and the radio-frequency output terminals 121 to 124 illustrated in FIG. 1. The plurality of post electrodes 150 are connected to input/output terminals and/or ground terminals and so forth on a mother board disposed in the negative z-axis direction from the radio-frequency module 1.

The resin member 94 covers the main surface 91b and the components on the main surface 91b. The resin member 94 has a function of ensuring the reliability, in terms of mechanical strength, moisture resistance and so on, of the components on the main surface 91b.

The shield electrode layer 95 is, for example, a thin metal film formed using a sputtering method and is formed so as to cover the top surface and side surfaces of the resin member 93, the side surfaces of the module substrate 91, and the side surfaces of the resin member 94. The shield electrode layer 95 is set to the ground potential and suppresses entry of external noise into the circuit components making up the radio-frequency module 1.

The configuration of the radio-frequency module 1 in FIGS. 2A, 2B, and 3 is merely an example and the radio-frequency module 1 is not limited to this configuration. For example, the radio-frequency module 1 does not have to include the resin member 93 or 94 or the shield electrode layer 95. The radio-frequency module 1 may include a plurality of bump electrodes instead of the plurality of post electrodes 150.

[1.3 Combinations of Bands A to D]

Next, bands A to D will be described. Bands A to D are examples of first to fourth bands, respectively. Each of the bands A to D is a frequency band for a communication system constructed using radio access technology (RAT). Each of the bands A to D is predefined by a standardization organization (for example, the 3rd Generation Partnership Project (3GPP) and the Institute of Electrical and Electronics Engineers (IEEE)). Examples of communication systems may include 5th Generation New Radio (5G NR) systems, Long Term Evolution (LTE) systems, and Wireless Local Area Network (WLAN) systems.

Bands A and B are a combination of bands in which simultaneous reception is allowed. For example, if bands A and B are frequency bands for LTE, then bands A and B can be used for interband carrier aggregation. Similarly, bands C and D are also a combination of bands in which simultaneous reception is allowed. Bands A and C are a combination of bands in which simultaneous reception is not allowed, and bands B and D are also a combination of bands in which simultaneous reception is not allowed.

Specific examples of such combinations of bands A to D are listed in Table 1 below.

TABLE 1

| No. | BAND A | BAND B | BAND C | BAND D |
|---|---|---|---|---|
| 1 | Band1 | Band3 | Band66 | Band25 |
| 2 | Band3 | Band1 | Band25 | Band66 |
| 3 | Band1 | Band3 | Band34 | Band39 |
| 4 | Band3 | Band1 | Band39 | Band34 |

TABLE 1-continued

| No. | BAND A | BAND B | BAND C | BAND D |
|---|---|---|---|---|
| 5 | Band66 | Band25 | Band34 | Band39 |
| 6 | Band25 | Band66 | Band39 | Band34 |
| 7 | Band66 | Band25 | Band1 | Band3 |
| 8 | Band25 | Band66 | Band3 | Band1 |
| 9 | Band34 | Band39 | Band1 | Band3 |
| 10 | Band39 | Band34 | Band3 | Band1 |
| 11 | Band34 | Band39 | Band66 | Band25 |
| 12 | Band39 | Band34 | Band25 | Band66 |
| 13 | Band1 | Band3 | Band66 | Band70 |
| 14 | Band3 | Band1 | Band70 | Band66 |
| 15 | Band66 | Band70 | Band34 | Band39 |
| 16 | Band70 | Band66 | Band39 | Band34 |
| 17 | Band70 | Band66 | Band1 | Band3 |
| 18 | Band66 | Band70 | Band3 | Band1 |
| 19 | Band34 | Band39 | Band66 | Band70 |
| 20 | Band39 | Band34 | Band70 | Band66 |

In Table 1, any one out of the combination of Band 1 and Band 3, the combination of Band 66 and Band 25 or Band 70, and the combination of Band 34 and Band 39, which are for LTE, may be used as the combination of bands A and B. Any one out of the two remaining combinations out of the combination of Band 1 and Band 3, the combination of Band 66 and Band 25 or Band 70, and the combination of Band 34 and Band 39, which are for LTE, may be used as the combination of bands C and D.

In Table 1, the band numbers are numbers representing LTE bands, but 5G NR bands can be used as bands A to D as well. In other words, any one out of the combination of n1 and n3, the combination of n66 and n25 or n70, and the combination of n34 and n39, which are for 5G NR, can be used as the combination of bands A and B. Any one out of the two remaining combinations out of the combination of n1 and n3, the combination of n66 and n25 or n70, and the combination of n34 and n39, which are for 5G NR, can be used as the combination of bands C and D.

The combinations of bands A to D listed in Table 1 are merely examples and the combinations are not limited to these examples.

[1.4 Effects and so Forth]

As described above, the radio-frequency module 1 according to this embodiment includes: the filter 61 having a pass band including at least part of band A; the filter 62 having a pass band including at least part of band B; the filter 63 having a pass band including at least part of band C; the filter 64 having a pass band including at least part of band D; the switch 51 having the terminal 511 connected to the antenna connection terminal 100, the terminal 512 connected to the input terminal 611 of the filter 61 and the input terminal 621 of the filter 62, and the terminal 513 connected to the input terminal 631 of the filter 63 and the input terminal 641 of the filter 64; the low-noise amplifiers 21 and 23 respectively connected to the output terminal 612 of the filter 61 and the output terminal 632 of the filter 63; the low-noise amplifiers 22 and 24 respectively connected to the output terminal 622 of the filter 62 and the output terminal 642 of the filter 64; and the module substrate 91 having the main surfaces 91a and 91b, which face each other. The filters 61 and 63 are included in one integrated circuit 81 disposed on the main surface 91a. The filters 62 and 64 are included in one integrated circuit 82 disposed on the main surface 91a. The low-noise amplifiers 21 and 23 are disposed on the main surface 91b. The integrated circuit 81 and the low-noise amplifiers 21 and 23 at least partially overlap in plan view.

Thus, the two filters 61 and 63 are formed in one integrated circuit 81 and the two filters 62 and 64 are formed in one integrated circuit 82. The two filters 61 and 62 connected to the terminal 512 of the switch 51 are formed in separate integrated circuits 81 and 82, and the two filters 63 and 64 connected to the terminal 513 of the switch 51 are formed in separate integrated circuits 81 and 82. Therefore, interference between radio-frequency signals passing through two filters connected to the same terminal can be suppressed, and degradation of electrical characteristics resulting from miniaturization of the radio-frequency module 1 can be suppressed. The low-noise amplifiers 21 and 23, which are respectively connected to the filters 61 and 63, are disposed so as to overlap the integrated circuit 81, which includes the filters 61 and 63, in plan view. Therefore, the lengths of wiring lines respectively connecting the filters 61 and 63 to the low-noise amplifiers 21 and 23 can be shortened, and mismatching loss due to wiring loss and stray capacitances of the wiring lines can be suppressed. As a result, the electrical characteristics of the radio-frequency module 1 can be improved.

In addition, for example, in the radio-frequency module 1 according to this embodiment, the low-noise amplifiers 22 and 24 may be disposed on the main surface 91b, and the integrated circuit 82 and the low-noise amplifiers 22 and 24 may at least partially overlap in plan view.

Thus, the low-noise amplifiers 22 and 24, which are respectively connected to the filters 62 and 64, are disposed so as to overlap the integrated circuit 82, which includes the filters 62 and 64, in plan view. Therefore, the lengths of wiring lines respectively connecting the filters 62 and 64 to the low-noise amplifiers 22 and 24 can be shortened, and mismatching loss due to wiring loss and stray capacitances of the wiring lines can be suppressed. As a result, the electrical characteristics of the radio-frequency module 1 can be improved.

In addition, for example, in the radio-frequency module 1 according to this embodiment, the integrated circuit 81 may have the edges 811 and 812 facing each other in plan view, the integrated circuit 82 may have the edges 821 and 822 facing each other in plan view, the integrated circuits 81 and 82 may be disposed so that the edges 811 and 821 face each other in plan view, the switch 51 may be disposed on the main surface 91b, and at least part of the switch 51 may be disposed between the edge 811 of the integrated circuit 81 and the edge 821 of the integrated circuit 82 in plan view. In the integrated circuit 81, the input terminal 611 of the filter 61 and the input terminal 631 of the filter 63 may be disposed on the side where the edge 811 is located. In the integrated circuit 82, the input terminal 621 of the filter 62 and the input terminal 641 of the filter 64 may be disposed on the side where the edge 821 is located.

Thus, the input terminals 611, 621, 631, and 641 of the filters 61 to 64 are disposed near the switch 51. Therefore, the lengths of wiring lines connecting the input terminals 611, 621, 631, and 641 of the filters 61 to 64 to the switch 51 can be shortened, and mismatching losses due to wiring line loss and stray capacitances of the wiring lines can be suppressed. As a result, the electrical characteristics of the radio-frequency module 1 can be improved.

In addition, for example, in the radio-frequency module 1 according to this embodiment, in the integrated circuit 81, the output terminal 612 of the filter 61 and the output terminal 632 of the filter 63 may be disposed on the side where the edge 812 is located, and in the integrated circuit 82, the output terminal 622 of the filter 62 and the output terminal 642 of the filter 64 may be disposed on the side where the edge 822 is located.

With this configuration, the output terminal 612 of the filter 61 and the output terminal 622 of the filter 62 are respectively disposed on the sides where the edges 812 and 822, which do not face each other, are located. Therefore, interference between a band A signal passing through the filter 61 and a band B signal passing through the filter 62 can be suppressed. In addition, the output terminal 632 of the filter 63 and the output terminal 642 of the filter 64 are respectively disposed on the sides where the edges 812 and 822, which do not face each other, are located. Therefore, interference between a band C signal passing through the filter 63 and a band D signal passing through the filter 64 can be suppressed.

In addition, for example, in the radio-frequency module 1 according to this embodiment, the filters 61 and 62 may be disposed in a line perpendicular to the edge 811 in plan view, and the filters 63 and 64 may be disposed in a line perpendicular to the edge 811 in plan view.

Thus, by arranging the filters 61 and 62 in a direction perpendicular to the edge 811 and the filters 63 and 64 in a direction perpendicular to the edge 811, it easy to avoid a situation in which the wiring lines connecting the filters 61 and 62 to the terminal 512 of the switch 51 and the wiring lines connecting the filters 63 and 64 to the terminal 513 of the switch 51 cross each other. Therefore, isolation between the filters 61 and 62 and between the filters 63 and 64 can be improved and wiring line lengths can be shortened.

In addition, for example, the radio-frequency module 1 according to this embodiment may also include the inductor 71L disposed on the main surface 91a and connected between the terminal 512 of the switch 51 and at least one out of the input terminal 611 of the filter 61 and the input terminal 621 of the filter 62, and the inductor 72L disposed on the main surface 91a and connected between the terminal 513 of the switch 51 and at least one out of the input terminal 631 of the filter 63 and the input terminal 641 of the filter 64. The inductor 71L may be disposed between the filters 61 and 62 in plan view, and the inductor 72L may be disposed between the filters 63 and 64 in plan view.

Thus, by disposing the inductor 71L connected to the filter 61 and/or the filter 62 between the filters 61 and 62, the lengths of wiring lines connecting the filter 61 and/or the filter 62 to the inductor 71L can be shortened. In addition, by disposing the inductor 72L connected to the filter 63 and/or the filter 64 between the filters 63 and 64, the lengths of wiring lines connecting the filter 63 and/or the filter 64 to the inductor 72L can be shortened.

In addition, for example, the radio-frequency module 1 according to this embodiment may include the inductor 73L connected to the output terminal 612 of the filter 61, the inductor 74L connected to the output terminal 622 of the filter 62 and disposed on the main surface 91a, the inductor 75L connected to the output terminal 632 of the filter 63 and disposed on the main surface 91a, and the inductor 76L connected to the output terminal 642 of the filter 64 and disposed on the main surface 91a. The inductor 73L may be disposed at a position facing the filter 61 with the edge 812 therebetween in plan view. The inductor 74L may be disposed at a position facing the filter 62 with the edge 822 therebetween in plan view. The inductor 75L may be disposed at a position facing the filter 63 with the edge 812 therebetween in plan view. The inductor 76L may be disposed at a position facing the filter 64 with the edge 822 therebetween in plan view.

Thus, the inductors connected to the output terminals of the filters are disposed at positions facing those filters, and therefore the lengths of wiring lines connecting the output terminals of the filters to the inductors can be shortened. Furthermore, the inductor 73L connected to the output terminal 612 of the filter 61 and the inductor 74L connected to the output terminal 622 of the filter 62 can be disposed far apart from each other and this enables inductive coupling between the inductors 73L and 74L to be suppressed. Therefore, interference between a band A signal passing through the filter 61 and a band B signal passing through the filter 62 can be suppressed. Similarly, the inductor 75L connected to the output terminal 632 of the filter 63 and the inductor 76L connected to the output terminal 642 of the filter 64 can be disposed far apart from each other and this enables inductive coupling between the inductors 75L and 76L to be suppressed. Therefore, interference between a band C signal passing through the filter 63 and a band D signal passing through the filter 64 can be suppressed.

In addition, for example, in the radio-frequency module 1 according to this embodiment, the combination of bands A and B may be any one out of the combination of Band 1 and Band 3, the combination of Band 66 and Band 25 or Band 70, and the combination of Band 34 and Band 39, which are for LTE, and the combination of bands C and D may be any one out of the two remaining combinations out of the combination of Band 1 and Band 3, the combination of Band 66 and Band 25 or Band 70, and the combination of Band 34 and Band 39, which are for LTE.

Thus, the radio-frequency module 1 can be used for wireless communication using LTE bands.

In addition, for example, in the radio-frequency module 1 according to this embodiment, the combination of bands A and B may be any one out of the combination of n1 and n3, the combination of n66 and n25 or n70, and the combination of n34 and n39, which are for 5G NR, and the combination of bands C and D may be any one out of the two remaining combinations out of the combination of n1 and n3, the combination of n66 and n25 or n70, and the combination of n34 and n39, which are for 5G NR.

Thus, the radio-frequency module 1 can be used for wireless communication using 5G NR bands.

Embodiment 2

Next, Embodiment 2 will be described. This embodiment mainly differs from Embodiment 1 described above in that three filters are included in an integrated circuit. Hereafter, this embodiment will be described focusing on points that are different from Embodiment 1.

[2.1 Circuit Configurations of Radio-Frequency Module 1A and Communication Device 5A]

Figure 4:
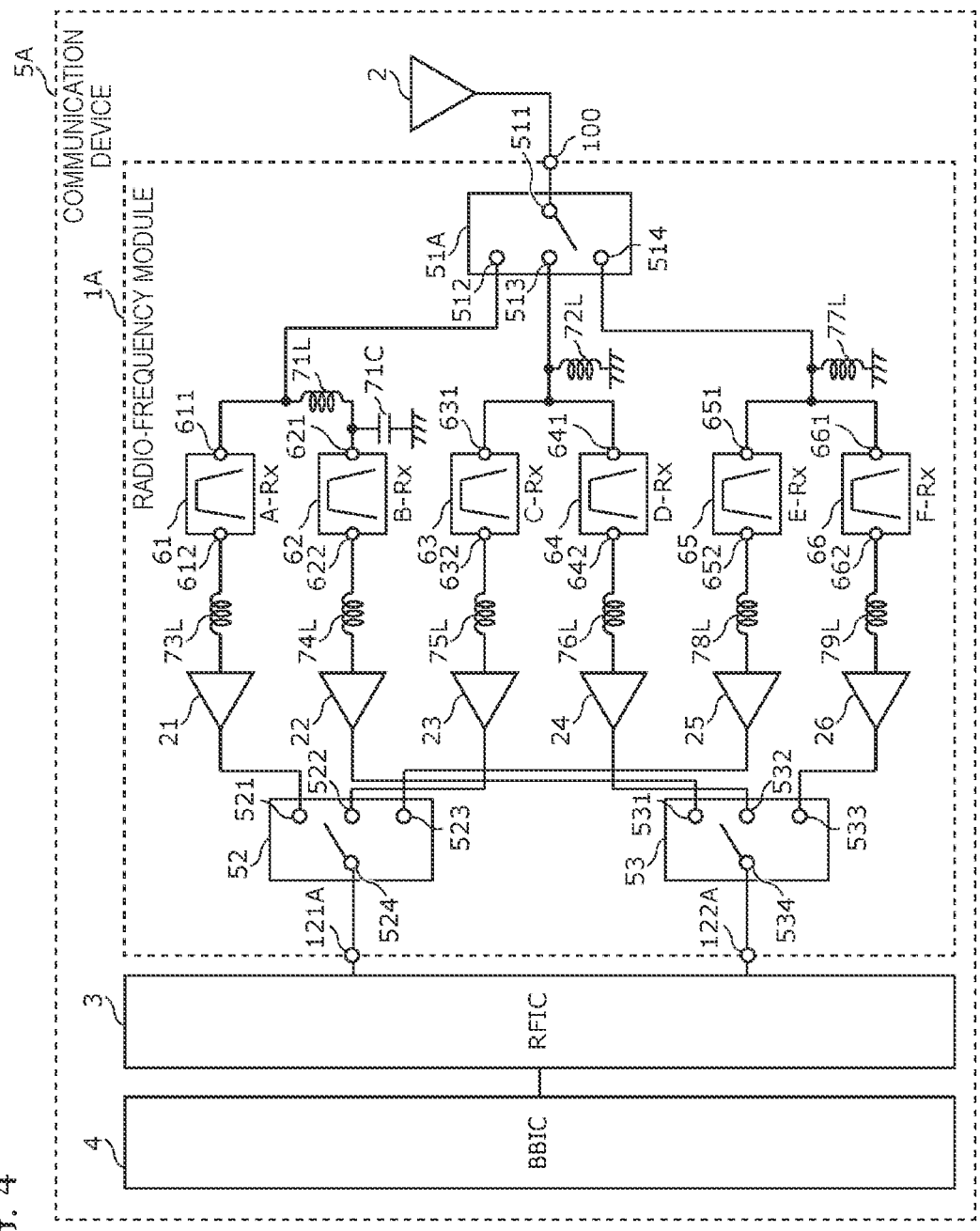
FIG. 4 is a circuit configuration diagram of a radio-frequency module and a communication device according to Embodiment 2.

First, the circuit configurations of a radio-frequency module 1A and a communication device 5A including the radio-frequency module 1A according to this embodiment will be described while referring to FIG. 4. FIG. 4 is a circuit configuration diagram of the radio-frequency module 1A and the communication device 5A according to Embodiment 2. The communication device 5A is substantially the same as the communication device 5 according to Embodiment 1 except that the communication device 5A includes the radio-frequency module 1A instead of the radio-frequency module 1. Therefore, hereafter, the description will focus on the circuit configuration of the radio-frequency module 1A.

The radio-frequency module 1A according to this embodiment includes low-noise amplifiers 21 to 26, switches 51A, 52, and 53, filters 61 to 66, a capacitor 71C, inductors 71L to 79L, an antenna connection terminal 100, and radio-frequency output terminals 121A and 122A.

The radio-frequency output terminals 121A and 122A are terminals for supplying radio-frequency reception signals to outside the radio-frequency module 1A. In this embodiment, the radio-frequency output terminals 121A and 122A are connected to an RFIC 3 outside the radio-frequency module 1A.

The low-noise amplifier 25 is an example of at least one first amplifier and can amplify a reception signal of band E received from the antenna connection terminal 100. The low-noise amplifier 25 is connected between the filter 65 and the radio-frequency output terminal 121A.
Specifically, an input terminal of the low-noise amplifier 25 is connected to the filter 65 via the inductor 73L and an output terminal of the low-noise amplifier 25 is connected to the radio-frequency output terminal 121A via the switch 52.

The low-noise amplifier 25 may be combined with the low-noise amplifiers 21 and 23 into one low-noise amplifier. In other words, the radio-frequency module 1A does not have to include the low-noise amplifiers 23 and 25. In this case, the radio-frequency module 1A may include a switch connected between the low-noise amplifier 21 and the filters 61, 63, and 65. This switch can switch the connection between the low-noise amplifier 21 and the filters 61, 63, and 65.

The low-noise amplifier 26 is an example of at least one second amplifier and can amplify a reception signal of Band F received from the antenna connection terminal 100. The low-noise amplifier 26 is connected between the filter 66 and the radio-frequency output terminal 122A.
Specifically, an input terminal of the low-noise amplifier 26 is connected to the filter 66 via the inductor 79L and an output terminal of the low-noise amplifier 26 is connected to the radio-frequency output terminal 122A via the switch 53.

The low-noise amplifier 26 may be combined with the low-noise amplifiers 22 and 24 into one low-noise amplifier. In other words, the radio-frequency module 1A does not have to include the low-noise amplifiers 24 and 26. In this case, the radio-frequency module 1A may include a switch connected between the low-noise amplifier 22 and the filters 62, 64, and 66. This switch can switch the connection between the low-noise amplifier 22 and the filters 62, 64, and 66.

The switch 51A has terminals 511 to 514. The terminal 511 is an example of a first terminal and is connected to the antenna connection terminal 100. The terminal 512 is an example of a second terminal and is connected to an input terminal 611 of the filter 61 and an input terminal 621 of the filter 62. The terminal 513 is an example of a third terminal and is connected to an input terminal 631 of the filter 63 and an input terminal 641 of the filter 64. The terminal 514 is an example of a fourth terminal and is connected to an input terminal 651 of the filter 65 and an input terminal 661 of the filter 66.

In this connection configuration, the switch 51A can connect the terminal 511 to any one of the terminals 512 to 514 on the basis of a control signal from the RFIC 3, for example. In other words, the switch 51A can switch the connection of the antenna 2 between the pair of filters 61 and 62, the pair of filters 63 and 64, and the pair of filters 65 and 66. The switch 51A is configured using a single-pole triple-throw (SP3T) type switch circuit for example, and may be referred to as an antenna switch.

The switch 52 has terminals 521 to 524. The terminal 521 is simply connected to the output of the low-noise amplifier 21. The terminal 522 is connected to the output terminal of the low-noise amplifier 23. The terminal 523 is connected to the output terminal of the low-noise amplifier 25. The terminal 524 is connected to the radio-frequency output terminal 121A.

In this connection configuration, the switch 52 can connect the terminal 521 to any one of the terminals 522 to 524 on the basis of a control signal from the RFIC 3, for example. In other words, the switch 52 can switch the connection of the radio-frequency output terminal 121A between the low-noise amplifiers 21, 23, and 25. The switch 52 is formed of a SP3T-type switch circuit, for example.

The switch 53 has terminals 531 to 534. The terminal 531 is simply connected to the output of the low-noise amplifier 22. The terminal 532 is connected to the output terminal of the low-noise amplifier 24. The terminal 533 is connected to the output terminal of the low-noise amplifier 26. The terminal 534 is connected to the radio-frequency output terminal 122A.

In this connection configuration, the switch 53 can connect the terminal 531 to any one of the terminals 532 to 534 on the basis of a control signal from the RFIC 3, for example. In other words, the switch 53 can switch the connection of the radio-frequency output terminal 122A between the low-noise amplifiers 22, 24, and 26. The switch 53 is formed of a SP3T-type switch circuit, for example.

The filter 65 (E-Rx) is an example of a fifth filter and has a pass band that includes band E. The filter 65 is connected between the switch 51A and the low-noise amplifier 23. Specifically, the input terminal 651 of the filter 65 is connected to the terminal 514 of the switch 51A, and an output terminal 652 of the filter 65 is connected to an input terminal of the low-noise amplifier 23 via the inductor 75L. Band E will be described later.

The filter 66 (F-Rx) is an example of a sixth filter and has a pass band that includes band F. The filter 66 is connected between the switch 51A and the low-noise amplifier 24. Specifically, the input terminal 661 of the filter 66 is connected to the terminal 514 of the switch 51A, and an output terminal 662 of the filter 66 is connected to an input terminal of the low-noise amplifier 24 via the inductor 76L. Band F will be described later.

The input terminal 651 of the filter 65 and the input terminal 661 of the filter 66 are both connected to the terminal 514 of the switch 51A and form a common terminal. The filters 65 and 66 may also be called a diplexer.

The inductor 77L is an example of a seventh inductor and is connected between the input terminal 651 of the filter 65 and the input terminal 661 of the filter 66, and the terminal 514 of the switch 51A. Specifically, the inductor 77L is connected between ground and a path connecting the input terminal 651 of the filter 65 to the terminal 514 of the switch 51A, and is connected between ground and a path connecting the input terminal 661 of the filter 66 to the terminal 514 of the switch 51A. Here, the inductor 77L is a so-called shunt inductor, but does not have to be a shunt inductor. The inductor 77L forms an impedance matching network and can provide impedance matching between the output impedance of the switch 51A and the input impedances of the filters 65 and 66.

The inductor 78L is an example of an eighth inductor and is connected to the output terminal 652 of the filter 65. Specifically, the inductor 78L is connected in series along a path connecting the output terminal 652 of the filter 65 and the input terminal of the low-noise amplifier 25 to each other. Here, the inductor 78L is a so-called series inductor, but does not have to be a series inductor. The inductor 78L forms an impedance matching network and can provide impedance matching between the output impedance of the filter 65 and the input impedance of the low-noise amplifier 25.

The inductor 79L is an example of a ninth inductor and is connected to the output terminal 662 of the filter 66. Specifically, the inductor 79L is connected in series along a path connecting the output terminal 662 of the filter 66 and the input terminal of the low-noise amplifier 26 to each other. Here, the inductor 79L is a so-called series inductor, but does not have to be a series inductor. The inductor 79L forms an impedance matching network and can provide impedance matching between the output impedance of the filter 66 and the input impedance of the low-noise amplifier 26.

[2.2 Arrangement of Components of Radio-Frequency Module 1A]

Next, an example of the arrangement of components of the radio-frequency module 1A configured as described above will be described in a specific manner while referring to FIGS. 5A and 5B.

Figure 5A:
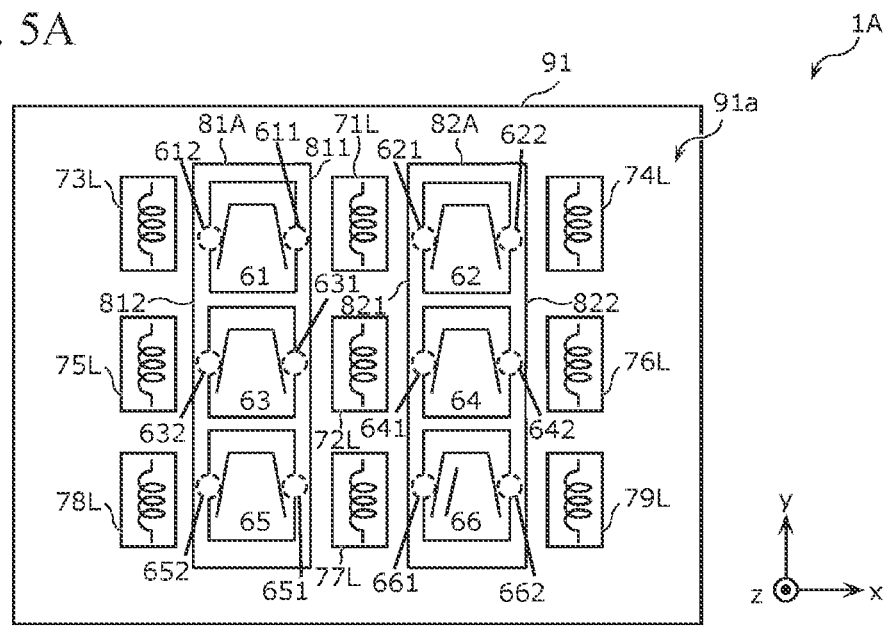
FIG. 5A is a plan view of the radio-frequency module according to Embodiment 2.

FIG. 5A is a plan view of the radio-frequency module 1A according to Embodiment 2. Specifically, FIG. 5A is a view of a main surface 91a of a module substrate 91 from the positive side of the z-axis. FIG. 5B is a planar see-through view of the radio-frequency module 1A according to Embodiment 2. Specifically, FIG. 5B is a see-through view of a main surface 91b of the module substrate 91 from the positive side of the z-axis.

Figure 5B:
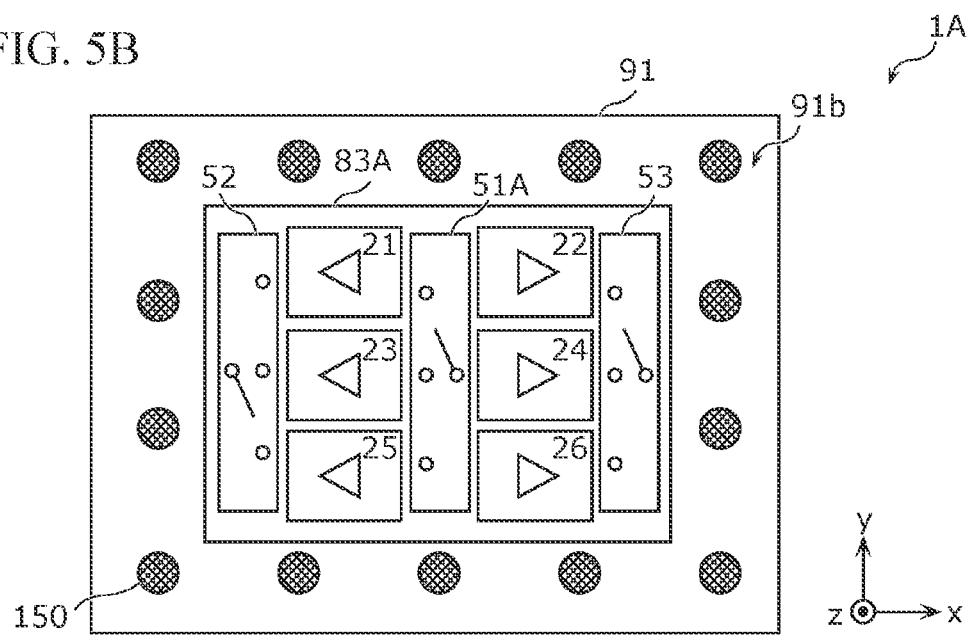
FIG. 5B is a planar see-through view of the radio-frequency module according to Embodiment 2.

As illustrated in FIGS. 5A and 5B, the radio-frequency module 1A includes, in addition to the circuit components including the circuit elements illustrated in FIG. 4, the module substrate 91, resin members 93 and 94, a shield electrode layer 95, and a plurality of post electrodes 150. Note that, in FIGS. 5A and 5B, illustration of the resin members 93 and 94, the shield electrode layer 95, and wiring lines connecting the plurality of components disposed on or in the module substrate 91 to each other is omitted.

The filters 61 to 66 and the inductors 71L to 79L are disposed on the main surface 91a. Similarly to the filters 61 to 64, the filters 65 and 66 may be, for example, SAW filters, acoustic wave filters using BAWs, LC resonance filters, or dielectric filters, but are not limited to these kinds of filters.

The filters 61, 63, and 65 are included in one integrated circuit 81A, and the filters 62, 64, and 66 are included in one integrated circuit 82A. In other words, the filters 61, 63, and 65 are integrated into a single chip, and the filters 62, 64, and 66 are integrated into a single chip.

The integrated circuit 81A is a single package including the filters 61, 63, and 65. The filters 61, 63, and 65 are disposed in a line along an edge 811 inside the integrated circuit 81A. Specifically, the filters 65, 63, and 61 are arrayed in this order along the y direction.

The input terminal 611 of the filter 61, the input terminal 631 of the filter 63, and the input terminal 651 of the filter 65 are disposed on the side of the integrated circuit 81A where the edge 811 is located. In other words, the edge 811 is nearer the input terminals 611, 631, and 651 than an edge 812. In addition, the output terminal 612 of the filter 61, the output terminal 632 of the filter 63, and the output terminal 652 of the filter 65 are disposed on the side of the integrated circuit 81A where the edge 812 is located. In other words, the edge 812 is nearer the output terminals 612, 632, and 652 than the edge 811.

The integrated circuit 82A is a single package including the filters 62, 64, and 66. The filters 62, 64, and 66 are disposed in a line along an edge 821 inside the integrated circuit 82A. Specifically, the filters 66, 64, and 62 are arrayed in this order along the y direction.

The input terminal 621 of the filter 62, the input terminal 641 of the filter 64, and the input terminal 661 of the filter 66 are disposed on the side of the integrated circuit 82A where the edge 821 is located. In other words, the edge 821 is nearer the input terminals 621, 641, and 661 than an edge 822. In addition, the output terminal 622 of the filter 62, the output terminal 642 of the filter 64, and the output terminal 662 of the filter 66 are disposed on the side of the integrated circuit 82A where the edge 822 is located. In other words, the edge 822 is nearer the output terminals 622, 642, and 662 than the edge 821.

The integrated circuits 81A and 82A are disposed so that the edges 811 and 821 face each other in plan view. That is, in the integrated circuit 81A, the edge 811 is closer to integrated circuit 82A than the edge 812, and in the integrated circuit 82A, the edge 821 is closer to the integrated circuit 81A than the edge 822.

The filter 61 inside the integrated circuit 81A and the filter 62 inside the integrated circuit 82A are arrayed in the x direction perpendicular to the edge 811 in plan view. In other words, the filters 61 and 62 are disposed so that a single straight line parallel to the x-axis passes through both the filters 61 and 62 in plan view. In addition, the filter 63 inside the integrated circuit 81A and the filter 64 inside the integrated circuit 82A are arrayed in the x direction perpendicular to the edge 811 in plan view. In other words, the filters 63 and 64 are disposed so that a single straight line parallel to the x-axis passes through both the filters 63 and 64 in plan view. In addition, the filter 65 inside the integrated circuit 81A and the filter 66 inside the integrated circuit 82A are arrayed in the x direction perpendicular to the edge 811 in plan view. In other words, the filters 65 and 66 are disposed so that a single straight line parallel to the x-axis passes through both the filters 65 and 66 in plan view.

Similarly to the inductors 71L to 76L, each of the inductors 77L to 79L is formed of an SMD, for example. The inductors 77L to 79L are not limited to SMDs.

In plan view, the inductor 77L is disposed between the filters 65 and 66, the inductor 78L is disposed at a position facing the filter 65 with the edge 812 therebetween, and the inductor 79L is disposed at a position facing the filter 66 with the edge 822 therebetween. In this case, the inductor 78L, the filter 65, the inductor 77L, the filter 66, and the inductor 79L are disposed in a row in the x direction in this order.

The low-noise amplifiers 21 to 26, the switch 51A, and the plurality of post electrodes 150 are disposed on the main surface 91b. The low-noise amplifiers 21 to 26 and the switch 51A are included in one integrated circuit 83A. Similarly to the integrated circuit 83 in Embodiment 1, the integrated circuit 83A is a semiconductor integrated circuit, and is configured using CMOS, for example.

Within the integrated circuit 83A, the low-noise amplifiers 21, 23, and 25 are arrayed in the y-direction, and the low-noise amplifiers 22, 24, 26 are also arrayed in the y-direction. The low-noise amplifiers 21 and 22 face each other in the x direction with the switch 51A therebetween, the low-noise amplifiers 23 and 24 also face each other in the x direction with the switch 51A therebetween, and the low-noise amplifiers 25 and 26 also face each other in the x direction with the switch 51A therebetween.

The low-noise amplifiers 21, 23, and 25 disposed on the main surface 91b overlap at least part of the integrated circuit 81A disposed on the main surface 91a in plan view. Similarly, the low-noise amplifiers 22, 24, and 26 overlap at least part of the integrated circuit 82A in plan view. At least part of the switch 51A is disposed between the edge 811 of the integrated circuit 81A and the edge 821 of the integrated circuit 82A in plan view.

In this embodiment, the low-noise amplifiers 21 to 26 and the switch 51A are included in the single integrated circuit 83A, but the embodiment is not limited to this configuration. For example, the low-noise amplifiers 21 to 26 and the switch 51A may be implemented separately from each other.

The configuration of the radio-frequency module 1A in FIGS. 5A and 5B is merely an example and the radio-frequency module 1A is not limited to this configuration. For example, the radio-frequency module 1A does not have to include the resin member 93 or 94 or the shield electrode layer 95. The radio-frequency module 1A may include a plurality of bump electrodes instead of the plurality of post electrodes 150.

[2.3 Combinations of Bands A to F]

Next, bands A to F will be described. Bands A to F are examples of first to sixth bands, respectively.

Similarly to as in Embodiment 1, each of the bands A to F is a frequency band for a communication system constructed using RAT.

Each of the pair of bands A and B, the pair of bands C and D, and the pair of bands E and F is a combination of bands in which simultaneous reception is allowed. Any combination of bands A, C, and E is a band combination in which simultaneous reception is not allowed, and any combination of bands B, D, and F is also a band combination in which simultaneous reception is not allowed.

Specific examples of such combinations of bands A to F are listed in Table 2 below.

TABLE 2

| No. | BAND A | BAND B | BAND C | BAND D | BAND E | BAND F |
|---|---|---|---|---|---|---|
| 1 | Band1 | Band3 | Band66 | Band25 | Band34 | Band39 |
| 2 | Band3 | Band1 | Band25 | Band66 | Band39 | Band34 |
| 3 | Band1 | Band3 | Band34 | Band39 | Band66 | Band25 |
| 4 | Band3 | Band1 | Band39 | Band34 | Band25 | Band66 |
| 5 | Band66 | Band25 | Band1 | Band3 | Band34 | Band39 |
| 6 | Band25 | Band66 | Band3 | Band1 | Band39 | Band34 |
| 7 | Band66 | Band25 | Band34 | Band39 | Band1 | Band3 |
| 8 | Band25 | Band66 | Band39 | Band34 | Band3 | Band1 |
| 9 | Band34 | Band39 | Band1 | Band3 | Band66 | Band25 |
| 10 | Band39 | Band34 | Band3 | Band1 | Band25 | Band66 |
| 11 | Band34 | Band39 | Band66 | Band25 | Band1 | Band3 |
| 12 | Band39 | Band34 | Band25 | Band66 | Band3 | Band1 |
| 13 | Band1 | Band3 | Band66 | Band70 | Band34 | Band39 |
| 14 | Band3 | Band1 | Band70 | Band66 | Band39 | Band34 |
| 15 | Band1 | Band3 | Band34 | Band39 | Band66 | Band70 |
| 16 | Band3 | Band1 | Band39 | Band34 | Band70 | Band66 |
| 17 | Band66 | Band70 | Band1 | Band3 | Band34 | Band39 |
| 18 | Band70 | Band66 | Band3 | Band1 | Band39 | Band34 |
| 19 | Band66 | Band70 | Band34 | Band39 | Band1 | Band3 |
| 20 | Band70 | Band66 | Band39 | Band34 | Band3 | Band1 |
| 21 | Band34 | Band39 | Band1 | Band3 | Band66 | Band70 |
| 22 | Band39 | Band34 | Band3 | Band1 | Band70 | Band66 |
| 23 | Band34 | Band39 | Band66 | Band70 | Band1 | Band3 |
| 24 | Band39 | Band34 | Band70 | Band66 | Band3 | Band1 |

In Table 2, any one of the combination of Band 1 and Band 3, the combination of Band 66 and Band 25 or Band 70, and the combination of Band 34 and Band 39, which are for LTE, may be used as the combination of bands A and B. Any one out of the two remaining combinations out of the combination of Band 1 and Band 3, the combination of Band 66 and Band 25 or Band 70, and the combination of Band 34 and Band 39, which are for LTE, may be used as the combination of bands C and D. The one remaining combination out of the combination of Band 1 and Band 3, the combination of Band 66 and Band 25 or Band 70, and the combination of Band 34 and Band 39, which are for LTE, may be used as the combination of bands E and F.

In Table 2, the band numbers are numbers representing LTE bands, but 5G NR bands can be used as bands A to F as well. In other words, any one out of the combination of n1 and n3, the combination of n66 and n25 or n70, and the combination of n34 and n39, which are for 5G NR, can be used as the combination of bands A and B. Any one out of the two remaining combinations out of the combination of n1 and n3, the combination of n66 and n25 or n70, and the combination of n34 and n39, which are for 5G NR, can be used as the combination of bands C and D. The one remaining combination out of the combination of n1 and n3, the combination of n66 and n25 or n70, and the combination of n34 and n39, which are for 5G NR, can be used as the combination of bands E and F.

The combinations of bands A to F illustrated in Table 2 are merely examples and the combinations are not limited to these examples.

[2.4 Effects and so Forth]

As described above, the radio-frequency module 1A according to this embodiment includes: the filter 61 having a pass band including at least part of band A; the filter 62 having a pass band including at least part of band B; the filter 63 having a pass band including at least part of band C; the filter 64 having a pass band including at least part of band D; the filter 65 having a pass band including at least part of band E; the filter 66 having a pass band including at least part of band F; the switch 51A having the terminal 511 connected to the antenna connection terminal 100, the terminal 512 connected to the input terminal 611 of the filter 61 and the input terminal 621 of the filter 62, the terminal 513 connected to the input terminal 631 of the filter 63 and the input terminal 641 of the filter 64, and the terminal 514 connected to the input terminal 651 of the filter 65 and the input terminal 661 of the filter 66; the low-noise amplifiers 21, 23, and 25 respectively connected to the output terminal 612 of the filter 61, the output terminal 632 of the filter 63, and the output terminal 652 of the filter 65; the low-noise amplifiers 22, 24, and 26 respectively connected to the output terminal 622 of the filter 62, the output terminal 642 of the filter 64, and the output terminal 662 of the filter 66; and the module substrate 91 having the main surfaces 91a and 91b, which face each other. The filters 61, 63, and 65 are included in one integrated circuit 81A disposed on the main surface 91a. The filters 62, 64, and 66 are included in one integrated circuit 82A disposed on the main surface 91a. The low-noise amplifiers 21, 23, and 25 are disposed on the main surface 91B. The integrated circuit 81A and the low-noise amplifiers 21, 23, and 25 at least partially overlap in plan view.

Thus, the three filters 61, 63, and 65 are formed in one integrated circuit 81A and the three filters 62, 64, and 66 are formed in one integrated circuit 82A. The two filters 61 and 62 connected to the terminal 512 of the switch 51A are formed in separate integrated circuits 81A and 82A, the two filters 63 and 64 connected to the terminal 513 of the switch 51A are formed in separate integrated circuits 81A and 82A, and the two filters 65 and 66 connected to the terminal 514 of the switch 51A are formed in separate integrated circuits 81A and 82A. Therefore, interference between radio-frequency signals passing through two filters connected to the same terminal can be suppressed, and degradation of electrical characteristics resulting from miniaturization of the radio-frequency module 1A can be suppressed. The low-noise amplifiers 21, 23, and 25, which are respectively connected to the filters 61, 63, and 65, are disposed so as to overlap the integrated circuit 81A, which includes the filters 61, 63, and 65, in plan view. Therefore, the lengths of wiring lines respectively connecting the filters 61, 63, and 65 to the low-noise amplifiers 21, 23, and 25 can be shortened, and mismatching loss due to wiring loss and stray capacitances of the wiring lines can be suppressed. As a result, the electrical characteristics of the radio-frequency module 1A can be improved.

In addition, for example, in the radio-frequency module 1A according to this embodiment, the integrated circuit 81A may have the edges 811 and 812 that face each other in plan view, the integrated circuit 82A may have the edges 821 and 822 that face each other in plan view, the integrated circuits 81A and 82A may be disposed such that the edges 811 and 821 face each other in plan view, the switch 51A may be disposed on the main surface 91b, at least part of the switch 51A may be disposed between the edge 811 of the integrated circuit 81A and the edge 821 of the integrated circuit 82A in plan view, in the integrated circuit 81A, the input terminal 611 of the filter 61, the input terminal 631 of the filter 63, and the input terminal 651 of the filter 65 may be disposed on the side where is the edge 811 is located, and in the integrated circuit 82A, the input terminal 621 of the filter 62, the input terminal 641 of the filter 64, and the input terminal 661 of the filter 66 may be disposed on the side where the edge 821 is located.

Thus, the input terminals 611, 621, 631, 641, 651, and 661 of the filters 61 to 66 are disposed near the switch 51A. Therefore, the lengths of wiring lines connecting the input terminals 611, 621, 631, 641, 651, and 661 of the filters 61 to 66 to the switch 51A can be shortened, and mismatching losses due to wiring line loss and stray capacitances of the wiring lines can be suppressed. As a result, the electrical characteristics of the radio-frequency module 1A can be improved.

In addition, for example, in the radio-frequency module 1A according to this embodiment, in the integrated circuit 81A, the output terminal 612 of the filter 61, the output terminal 632 of the filter 63, and the output terminal 652 of the filter 65 may be disposed on the side where the edge 812 is located, and in the integrated circuit 82A, the output terminal 622 of the filter 62, the output terminal 642 of the filter 64, and the output terminal 662 of the filter 66 may be disposed on side where the edge 822 is located.

With this configuration, the output terminal 612 of the filter 61 and the output terminal 622 of the filter 62 are respectively disposed on the sides where the edges 812 and 822, which do not face each other, are located. Therefore, interference between a band A signal passing through the filter 61 and a band B signal passing through the filter 62 can be suppressed. In addition, the output terminal 632 of the filter 63 and the output terminal 642 of the filter 64 are respectively disposed on the sides where the edges 812 and 822, which do not face each other, are located. Therefore, interference between a band C signal passing through the filter 63 and a band D signal passing through the filter 64 can be suppressed. In addition, the output terminal 652 of the filter 65 and the output terminal 662 of the filter 66 are respectively disposed on the sides where the edges 812 and 822, which do not face each other, are located. Therefore, interference between a band E signal passing through the filter 65 and a band F signal passing through the filter 66 can be suppressed.

In addition, for example, in the radio-frequency module 1A according to this embodiment, the filters 61 and 62 may be disposed in a line perpendicular to the edge 811 in plan view, the filters 63 and 64 may be disposed in a line perpendicular to the edge 811 in plan view, and the filters 65 and 66 may be disposed in a line perpendicular to the edge 811 in plan view.

Thus, it is easy to avoid a situation in which the wiring lines connecting the filters 61 and 62 to the terminal 512 of the switch 51A, the wiring lines connecting the filters 63 and 64 to the terminal 513 of the switch 51A, and the wiring lines connecting the filters 65 and 66 to the terminal 514 of the switch 51A cross each other by arraying the filters 61 and 62 in a direction perpendicular to the edge 811, arraying the filters 63 and 64 in a direction perpendicular to the edge 811, and arraying the filters 65 and 66 in a direction perpendicular to the edge 811. Therefore, isolation between the filters 61 and 62, between the filters 63 and 64, and between the filters 65 and 66 can be improved and wiring line lengths can be shortened.

In addition, for example, the radio-frequency module 1A according to this embodiment may further include: the inductor 71L connected between the terminal 512 of the switch 51A and at least one out of the input terminal 611 of the filter 61 and the input terminal 621 of the filter 62 and disposed on the main surface 91a; the inductor 72L connected between the terminal 513 of the switch 51A and at least one out of the input terminal 631 of the filter 63 and the input terminal 641 of the filter 64 and disposed on the main surface 91a; and the inductor 77L connected between the terminal 514 of the switch 51A and at least one out of the input terminal 641 of the filter 64 and the input terminal 651 of the filter 65 and disposed on the main surface 91a. The inductor 71L may be disposed between the filter 61 and the filter 62 in plan view. The inductor 72L may be disposed between the filter 63 and the filter 64 in plan view. The inductor 77L may be disposed between the filter 65 and the filter 66 in plan view.

Thus, by disposing the inductor 71L connected to the filter 61 and/or the filter 62 between the filters 61 and 62, the lengths of wiring lines connecting the filter 61 and/or the filter 62 to the inductor 71L can be shortened. In addition, by disposing the inductor 72L connected to the filter 63 and/or the filter 64 between the filters 63 and 64, the lengths of wiring lines connecting the filter 63 and/or the filter 64 to the inductor 72L can be shortened. In addition, by disposing the inductor 77L connected to the filter 65 and/or the filter 66 between the filters 65 and 66, the lengths of wiring lines connecting the filter 65 and/or the filter 66 to the inductor 77L can be shortened.

In addition, for example, the radio-frequency module 1A according to this embodiment may include: the inductor 73L connected to the output terminal 612 of the filter 61 and disposed on the main surface 91a; the inductor 74L connected to the output terminal 622 of the filter 62 and disposed on the main surface 91a; the inductor 75L connected to the output terminal 632 of the filter 63 and disposed on the main surface 91a; the inductor 76L connected to the output terminal 642 of the filter 64 and disposed on the main surface 91a; the inductor 78L connected to the output terminal 652 of the filter 65 and disposed on main surface 91a; and the inductor 79L connected to output terminal 662 of filter 66 and disposed on the main surface 91a. The inductor 73L may be disposed at a position facing the filter 61 with the edge 812 therebetween in plan view. The inductor 74L may be disposed at a position facing the filter 62 with the edge 822 therebetween in plan view. The inductor 75L may be disposed at a position facing the filter 63 with the edge 812 therebetween in plan view. The inductor 76L may be disposed at a position facing the filter 64 with the edge 822 therebetween in plan view. The inductor 78L may be disposed at a position facing the filter 65 with the edge 812 therebetween in plan view. The inductor 79L may be disposed at a position facing the filter 66 with the edge 822 therebetween in plan view.

Thus, the inductors connected to the output terminals of the filters are disposed at positions facing those filters, and therefore the lengths of wiring lines connecting the output terminals of the filters to the inductors can be shortened. Furthermore, the inductor 73L connected to the output terminal 612 of the filter 61 and the inductor 74L connected to the output terminal 622 of the filter 62 can be disposed far apart from each other and this enables inductive coupling between the inductors 73L and 74L to be suppressed. Therefore, interference between a band A signal passing through the filter 61 and a band B signal passing through the filter 62 can be suppressed. Similarly, the inductor 75L connected to the output terminal 632 of the filter 63 and the inductor 76L connected to the output terminal 642 of the filter 64 can be disposed far apart from each other and this enables inductive coupling between the inductors 75L and 76L to be suppressed. Therefore, interference between a band C signal passing through the filter 63 and a band D signal passing through the filter 64 can be suppressed. Similarly, the inductor 78L connected to the output terminal 642 of the filter 64 and the inductor 79L connected to the output terminal 662 of the filter 66 can be disposed far apart from each other and this enables inductive coupling between the inductors 78L and 79L to be suppressed. Therefore, interference between a band E signal passing through the filter 65 and a band F signal passing through the filter 66 can be suppressed.

In addition, for example, in the radio-frequency module 1A according to this embodiment, the combination of bands A and B may be any one out of the combination of Band 1 and Band 3, the combination of Band 66 and Band 25 or Band 70, and the combination of Band 34 and Band 39, which are for LTE, the combination of bands C and D may be any one out of the two remaining combinations out of the combination of Band 1 and Band 3, the combination of Band 66 and Band 25 or Band 70, and the combination of Band 34 and Band 39, which are for LTE, and the combination of bands E and F may be the one remaining combination out of the combination of Band 1 and Band 3, the combination of Band 66 and Band 25 or Band 70, and the combination of Band 34 and Band 39, which are for LTE.

Thus, the radio-frequency module 1A can be used for wireless communication using LTE bands.

In addition, for example, in the radio-frequency module 1A according to this embodiment, the combination of bands A and B may be any one out of the combination of n1 and n3, the combination of n66 and n25 or n70, and the combination of n34 and n39, which are for 5G NR, the combination of bands C and D may be any one out of the two remaining combinations out of the combination of n1 and n3, the combination of n66 and n25 or n70, and the combinations of n34 and n39, which are for 5G NR, and the combination of bands E and F may be the one remaining combination out of the combination of n1 and n3, the combination of n66 and n25 or n70, and the combination of n34 and n39, which are for 5G NR.

Thus, the radio-frequency module 1A can be used for wireless communication using 5G NR bands.

Modification of Embodiment 2

Next, a modification of Embodiment 2 will be described. This modification mainly differs from Embodiment 2 with respect to the arrangement of multiple filters inside integrated chips. Hereafter, this modification will be described focusing on points that are different from Embodiment 2.

The circuit configurations of the radio-frequency module and the communication device according to this modification are substantially the same as those in Embodiment 2 and therefore illustration and description thereof are omitted.

[3.1 Arrangement Configuration of Radio-Frequency Module 1B]

Figure 6:
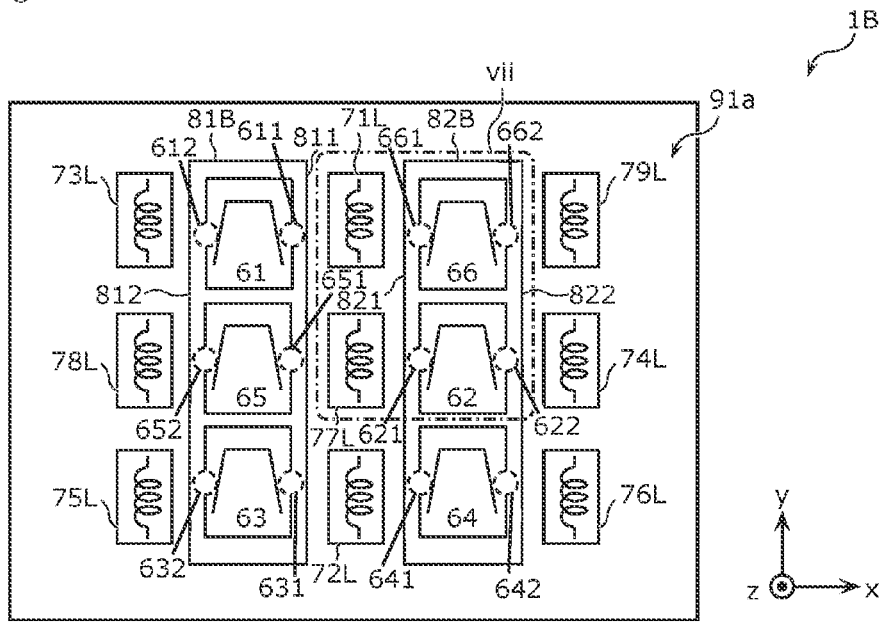
FIG. 6 is a plan view of a radio-frequency module according to a modification of Embodiment 2.
Figure 7:
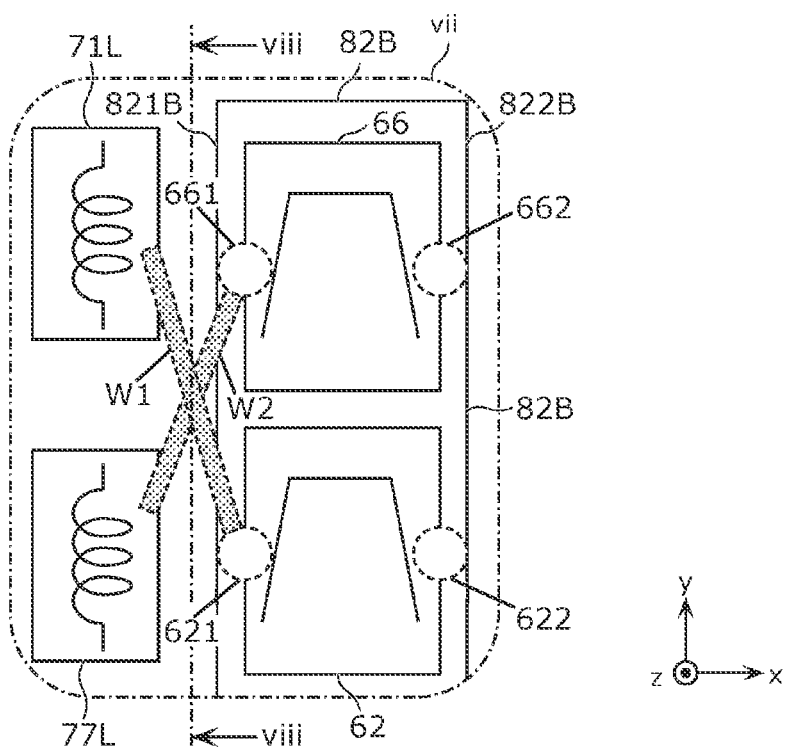
FIG. 7 is an enlarged plan view of a radio-frequency module according to a modification of Embodiment 2.
Figure 8:
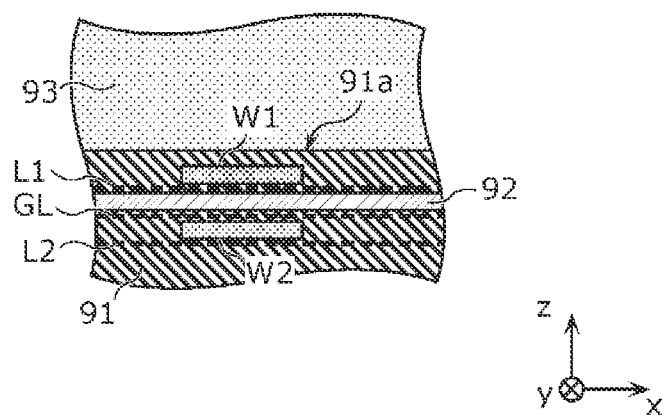
FIG. 8 is an enlarged sectional view of a radio-frequency module according to a modification of Embodiment 2.

An example of the arrangement of components of a radio-frequency module 1B according to this modification will be specifically described while referring to FIGS. 6 to 8.

FIG. 6 is a plan view of the radio-frequency module 1B according to the modification of Embodiment 2. Specifically, FIG. 6 is a view of a main surface 91a of a module substrate 91 from the positive side of the z-axis. FIG. 7 is an enlarged plan view of the radio-frequency module 1B according to the modification of Embodiment 2. Specifically, FIG. 7 is an enlarged view of area vii in FIG. 6. FIG. 8 is an enlarged sectional view of the radio-frequency module 1B according to the modification of Embodiment 2. Specifically, the cross-section of the radio-frequency module 1B in FIG. 8 is a cross-section taken along line viii-viii in FIG. 7. In FIG. 6 and FIG. 8, illustration of wiring lines connecting the multiple components disposed on or in the module substrate 91 to each other is omitted.

As illustrated in FIG. 6, in the radio-frequency module 1B according to this modification, filters 61, 63, and 65 are included in an integrated circuit 81B and filters 62, 64, and 66 are included in an integrated circuit 82B.

The filters 61, 63, and 65 are disposed in a line along an edge 811 inside the integrated circuit 81B. Specifically, the filters 63, 65, and 61 are arrayed in this order along the y direction. In other words, the filter 65 is disposed between the filters 61 and 63 in plan view.

On the other hand, the filters 62, 64, and 66 are disposed in a line along an edge 821 inside the integrated circuit 82B. Specifically, the filters 64, 62, and 66 are arrayed in this order along the y direction. In other words, the filter 62 is disposed between the filters 64 and 66 in plan view.

The filter 61 inside the integrated circuit 81B and the filter 66 inside the integrated circuit 82B are arrayed in the x direction perpendicular to the edge 811 in plan view. In other words, the filters 61 and 66 are disposed so that a single straight line parallel to the x-axis passes through both the filters 61 and 62 in plan view. In addition, the filter 65 inside the integrated circuit 81B and the filter 62 inside the integrated circuit 82B are arrayed in the x direction perpendicular to the edge 811 in plan view. In other words, the filters 65 and 62 are disposed so that a single straight line parallel to the x-axis passes through both the filters 65 and 62 in plan view. In addition, the filter 63 inside the integrated circuit 81B and the filter 64 inside the integrated circuit 82B are arrayed in the x direction perpendicular to the edge 811 in plan view. In other words, the filters 63 and 64 are disposed so that a single straight line parallel to the x-axis passes through both the filters 63 and 64 in plan view.

In plan view, the inductor 71L is disposed between the filters 61 and 66, the inductor 73L is disposed at a position facing the filter 61 with the edge 812 therebetween, and the inductor 79L is disposed at a position facing the filter 66 with the edge 822 therebetween. In this case, the inductor 73L, the filter 61, the inductor 71L, the filter 66, and the inductor 79L are disposed in a row in the x direction in this order.

In plan view, the inductor 77L is disposed between the filters 65 and 62, the inductor 78L is disposed at a position facing the filter 65 with the edge 812 therebetween, and the inductor 74L is disposed at a position facing the filter 62 with the edge 822 therebetween. In this case, the inductor 78L, the filter 65, the inductor 77L, the filter 62, and the inductor 74L are disposed in a row in the x direction in this order.

In plan view, the inductor 72L is disposed between the filters 63 and 64, the inductor 75L is disposed at a position facing the filter 63 with the edge 812 therebetween, and the inductor 76L is disposed at a position facing the filter 64 with the edge 822 therebetween. In this case, the inductor 75L, the filter 63, the inductor 72L, the filter 64, and the inductor 76L are disposed in a row in the x direction in this order.

As illustrated in FIG. 7, the filter 62 and the inductor 71L are connected to each other by a wiring line W1. The filter 66 and the inductor 77L are connected to each other by a wiring line W2.

As illustrated in FIG. 8, the wiring line W1 is an example of a first wiring line and is disposed in a wiring line layer L1 of the module substrate 91. The wiring line W2 is an example of a second wiring line and is disposed in a wiring line layer L2 of the module substrate 91. The wiring line layers L1 and L2 are respectively examples of a first wiring line layer and a second wiring line layer, and a ground layer GL, in which the ground electrode pattern 92 is formed, is disposed between the wiring line layers L1 and L2. As a result, the ground electrode pattern 92 is located between the wiring lines W1 and W2.

In FIG. 7 and FIG. 8, the wiring lines W1 and W2 are represented in a simplified manner and are not limited to this representation.

[3.2 Combinations of Bands A to F]

Next, bands A to F will be described. In this modification, bands A and C partially overlap each other. In addition, band E does not overlap band A or C.

Furthermore, the center frequency of band B is lower than the center frequency of band D and lower than the center frequency of band F. As a specific example of bands A to F, band combination No. 1 in Table 2 can be used.

[3.3 Effects and so Forth]

As described above, in the radio-frequency module 1B according to this embodiment, bands A and C at least partially overlap each other, band E does not overlap band A or C, and the filter 65 is disposed between the filters 61 and 63 in plan view.

With this configuration, the filter 65 for band E, which does not overlap band A or C, is disposed between the filters 61 and 63 for bands A and C, which at least partially overlap each other, and as a result, the isolation between the filters 61 and 63 can be improved.

In addition, for example, in the radio-frequency module 1B according to this embodiment, the center frequency of band B may be lower than the center frequency of band D and lower than the center frequency of band F, and the filter 62 may be disposed between the filters 64 and 66 in plan view.

As a result, the filter 62 for band B, which is located at the lowest frequency, is disposed between the filters 64 and 66 for bands D and F. Therefore, the isolation between the filters 64 and 66 for bands D and F, which are adjacent to each other on the high-frequency side, can be improved.

In addition, for example, the radio-frequency module 1B according to this embodiment may include: the inductor 71L connected between the terminal 512 of the switch 51A and at least one out of the input terminal 611 of the filter 61 and the input terminal 621 of the filter 62 and disposed on the main surface 91a; the inductor 72L connected between the terminal 513 of the switch 51A and at least one out of the input terminal 631 of the filter 63 and the input terminal 641 of the filter 64 and disposed on the main surface 91a; and the inductor 77L connected between the terminal 514 of the switch 51A and at least one out of the input terminal 651 of the filter 65 and the input terminal 661 of the filter 66 and disposed on main surface 91a. The inductor 71L may be disposed between the filters 61 and 66 in plan view. The inductor 72L may be disposed between the filters 63 and 64 in plan view. The inductor 77L may be disposed between the filters 65 and 62 in plan view. The module substrate 91 may include the wiring line layer L1, the wiring line layer L2, and the ground layer GL disposed between the wiring line layers L1 and L2. The wiring line W1 connecting the input terminal 621 of the filter 62 to the inductor 71L may be disposed in the wiring line layer L1. The wiring line W2 connecting the input terminal 661 of the filter 66 to the inductor 77L may be disposed in the wiring line layer L2.

With this configuration, even when the wiring line W1 connecting the input terminal 621 of the filter 62 to the inductor 71L and the wiring line W2 connecting the input terminal 661 of the filter 66 to the inductor 77L cross each other in plan view, the ground layer GL can be placed between the wiring lines W1 and W2, and therefore the isolation between the wiring lines W1 and W2 can be improved.

OTHER EMBODIMENTS

The radio-frequency module and communication device according to the present disclosure described above have been described on the basis of embodiments, but a radio-frequency module and a communication device according to the present disclosure are not limited to the above-described embodiments. Other embodiments realized by combining any of the constituent elements of the above-described embodiments with one another, modifications obtained by modifying the above-described embodiments in various ways, as thought of by one skilled in the art, while not departing from the gist of the present disclosure, and various devices having the radio-frequency module and communication device built thereinto are included in the scope of the present disclosure.

For example, in the circuit configurations of the radio-frequency modules and communication devices according to the embodiments described above, other circuit elements, wiring lines, and so forth may be inserted midway along paths that connect the circuit elements and signal paths disclosed in the drawings.

In each of the above embodiments, the radio-frequency module is a reception module, but the radio-frequency module does not have to be a reception module. For example, the radio-frequency module may be a transmission module. In this case, the radio-frequency module may include power amplifiers instead of low-noise amplifiers. Furthermore, the radio-frequency module may be a transmission/reception module.

In each of the above embodiments, the radio-frequency module may further include reception paths for other bands. In this case, for example, bands included in a second band group, which is different from a first band group including bands A to F, can be used as the other bands. For example, a middle band group (1427 to 2200 MHz) and a high band group (2300 to 2690 MHz) can be used as the first band group and the second band group, but the first and second band groups are not limited to these band groups.

INDUSTRIAL APPLICABILITY

The present disclosure can be widely used in communication devices such as mobile phones as a radio-frequency module that is disposed in a front end unit.

REFERENCE SIGNS LIST 1, 1A, 1B radio-frequency module
2 antenna
3 RFIC
4 BBIC
5, 5A communication device
21, 22, 23, 24, 25, 26 low-noise amplifier
51, 51A, 52, 53 switch
61, 62, 63, 64, 65, 66 filter
71C capacitor
71L, 72L, 73L, 74L, 75L, 76L, 77L, 78L, 79L inductor
81, 82 integrated circuit
91 module substrate
91a, 91b main surface
92 ground electrode pattern
93, 94 resin member
95 shield electrode layer
100 antenna connection terminal
121, 121A, 122, 122A, 123, 124 radio-frequency output terminal
150 post electrode
511, 512, 513, 514, 521, 522, 523, 524, 531, 532, 533, 534 terminal
611, 621, 631, 641, 651, 661 input terminal
612, 622, 632, 642, 652, 662 output terminal
811, 812, 821, 822 edge
GL ground layer
L1, L2 wiring line layer
W1, W2 wiring line

The invention claimed is:

1. A radio-frequency module comprising:
a first filter having a pass band including at least part of a first band;
a second filter having a pass band including at least part of a second band;
a third filter having a pass band including at least part of a third band;
a fourth filter having a pass band including at least part of a fourth band;
a switch having a first terminal connected to an antenna connection terminal, a second terminal connected to an input terminal of the first filter and an input terminal of the second filter, and a third terminal connected to an input terminal of the third filter and an input terminal of the fourth filter;
at least one first amplifier connected to an output terminal of the first filter and an output terminal of the third filter;
at least one second amplifier connected to an output terminal of the second filter and an output terminal of the fourth filter; and
a module substrate having a first main surface and a second main surface that face each other,
wherein the first filter and the third filter are in one first integrated circuit on the first main surface,
wherein the second filter and the fourth filter are in one second integrated circuit on the first main surface,
wherein the at least one first amplifier is on the second main surface,
wherein the first integrated circuit and the at least one first amplifier at least partially overlap in a plan view,
wherein the at least one second amplifier is on the second main surface,
wherein the second integrated circuit and the at least one second amplifier at least partially overlap in the plan view,
wherein the first integrated circuit has a first edge and a second edge that face each other in the plan view,
wherein the second integrated circuit has a third edge and a fourth edge that face each other in the plan view,
wherein the first edge of the first integrated circuit and the third edge of the second integrated circuit face each other in the plan view,
wherein the switch is on the second main surface,
wherein at least part of the switch is between the first edge of the first integrated circuit and the third edge of the second integrated circuit in the plan view,
wherein in the first integrated circuit, the input terminal of the first filter and the input terminal of the third filter are on a side of the first integrated circuit corresponding to the first edge, and
wherein in the second integrated circuit, the input terminal of the second filter and the input terminal of the fourth filter are on a side of the second integrated circuit corresponding to the third edge.

2. The radio-frequency module according to claim 1,
wherein in the first integrated circuit, the output terminal of the first filter and the output terminal of the third filter are on a side of the first integrated circuit corresponding to the second edge, and
wherein in the second integrated circuit, the output terminal of the second filter and the output terminal of the fourth filter are on a side of the second integrated circuit corresponding to the fourth edge.

3. The radio-frequency module according to claim 2,
wherein the first filter and the second filter are in a line in a direction perpendicular to the first edge in the plan view, and
wherein the third filter and the fourth filter are in another line in the direction perpendicular to the first edge in the plan view.

4. The radio-frequency module according to claim 3, further comprising:
a first inductor connected between the second terminal of the switch and the input terminal of the first filter or the input terminal of the second filter, and on the first main surface; and
a second inductor connected between the third terminal of the switch and the input terminal of the third filter or the input terminal of the fourth filter, and on the first main surface,
wherein the first inductor is between the first filter and the second filter in the plan view, and
wherein the second inductor is between the third filter and the fourth filter in the plan view.

5. The radio-frequency module according to claim 4, further comprising:
a third inductor connected to the output terminal of the first filter, and on the first main surface;
a fourth inductor connected to the output terminal of the second filter, and on the first main surface;
a fifth inductor connected to the output terminal of the third filter, and on the first main surface; and a sixth inductor connected to the output terminal of the fourth filter, and on the first main surface, wherein the third inductor is at a position facing the first filter with the second edge therebetween in the plan view, wherein the fourth inductor is at a position facing the second filter with the fourth edge therebetween in the plan view, wherein the fifth inductor is at a position facing the third filter with the second edge therebetween in the plan view, and wherein the sixth inductor is at a position facing the fourth filter with the fourth edge therebetween in the plan view.

6. The radio-frequency module according to claim 1, further comprising:
   a fifth filter having a pass band including at least part of a fifth band; and
   a sixth filter having a pass band including at least part of a sixth band,
   wherein the switch has a fourth terminal connected to an input terminal of the fifth filter and an input terminal of the sixth filter,
   wherein the at least one first amplifier is connected to an output terminal of the fifth filter,
   wherein the at least one second amplifier is connected to an output terminal of the sixth filter,
   wherein the first integrated circuit includes the fifth filter, and
   wherein the second integrated circuit includes the sixth filter.

7. The radio-frequency module according to claim 6,
   wherein the first integrated circuit has a first edge and a second edge that face each other in the plan view,
   wherein the second integrated circuit has a third edge and a fourth edge that face each other in the plan view,
   wherein the first edge of the first integrated circuit and the third edge of the second integrated circuit face each other in the plan view,
   wherein the switch is on the second main surface,
   wherein at least part of the switch is between the first edge of the first integrated circuit and the third edge of the second integrated circuit in the plan view,
   wherein in the first integrated circuit, the input terminal of the first filter, the input terminal of the third filter, and the input terminal of the fifth filter are on a side of the first integrated circuit corresponding to the first edge, and
   wherein in the second integrated circuit, the input terminal of the second filter, the input terminal of the fourth filter, and the input terminal of the sixth filter are on a side of the second integrated circuit corresponding to the third edge.

8. The radio-frequency module according to claim 7,
   wherein in the first integrated circuit, the output terminal of the first filter, the output terminal of the third filter, and the output terminal of the fifth filter are on a side of the first integrated circuit corresponding to the second edge, and
   wherein in the second integrated circuit, the output terminal of the second filter, the output terminal of the fourth filter, and the output terminal of the sixth filter are on a side of the second integrated circuit corresponding to the fourth edge.

9. The radio-frequency module according to claim 8,
   wherein the first filter and the second filter are in a line in a direction perpendicular to the first edge in the plan view,
   wherein the third filter and the fourth filter are in a second line in the direction perpendicular to the first edge in the plan view, and
   wherein the fifth filter and the sixth filter are in a third line in the direction perpendicular to the first edge in plan view.

10. The radio-frequency module according to claim 9, further comprising:
    a first inductor connected between the second terminal of the switch and the input terminal of the first filter or the input terminal of the second filter, and on the first main surface;
    a second inductor connected between the third terminal of the switch the input terminal of the third filter or the input terminal of the fourth filter, and on the first main surface; and
    a seventh inductor connected between the fourth terminal of the switch and the input terminal of the fourth filter or the input terminal of the fifth filter, and on the first main surface,
    wherein the first inductor is between the first filter and the second filter in the plan view,
    wherein the second inductor is between the third filter and the fourth filter in the plan view, and
    wherein the seventh inductor is between the fifth filter and the sixth filter in the plan view.

11. The radio-frequency module according to claim 10, further comprising:
    a third inductor connected to the output terminal of the first filter, and on the first main surface;
    a fourth inductor connected to the output terminal of the second filter, and on the first main surface;
    a fifth inductor connected to the output terminal of the third filter, and on the first main surface;
    a sixth inductor connected to the output terminal of the fourth filter, and on the first main surface;
    an eighth inductor connected to the output terminal of the fifth filter, and on the first main surface; and
    a ninth inductor connected to the output terminal of the sixth filter, and on the first main surface,
    wherein the third inductor is at a position facing the first filter with the second edge therebetween in the plan view,
    wherein the fourth inductor is at a position facing the second filter with the fourth edge therebetween in the plan view,
    wherein the fifth inductor is at a position facing the third filter with the second edge therebetween in the plan view,
    wherein the sixth inductor is at a position facing the fourth filter with the fourth edge therebetween in the plan view,
    wherein the eighth inductor is at a position facing the fifth filter with the second edge therebetween in the plan view, and
    wherein the ninth inductor is at a position facing the sixth inductor with the fourth edge therebetween in the plan view.

12. The radio-frequency module according to claim 6,
    wherein the first band and the third band at least partially overlap,
    wherein the fifth band does not overlap the first band or the third band, and wherein the fifth filter is between the first filter and the third filter in the plan view.

13. The radio-frequency module according to claim 12, wherein a center frequency of the second band is lower than a center frequency of the fourth band, and lower than a center frequency of the sixth band, and
wherein the second filter is between the fourth filter and the sixth filter in the plan view.

14. The radio-frequency module according to claim 13, further comprising:
a first inductor connected between the second terminal of the switch and the input terminal of the first filter or the input terminal of the second filter, and on the first main surface;
a second inductor connected between the third terminal of the switch and the input terminal of the third filter or the input terminal of the fourth filter, and on the first main surface; and
a seventh inductor connected between the fourth terminal of the switch and the input terminal of the fifth filter or the input terminal of the sixth filter, and on the first main surface,
wherein the first inductor is between the first filter and the sixth filter in the plan view,
wherein the second inductor is between the third filter and the fourth filter in the plan view,
wherein the seventh inductor is between the fifth filter and the second filter in the plan view,
wherein the module substrate comprises a first wiring line layer, a second wiring line layer, and a ground layer between the first wiring line layer and the second wiring line layer,
wherein a first wiring line connecting the input terminal of the second filter to the first inductor is in the first wiring line layer, and
wherein a second wiring line connecting the input terminal of the sixth filter to the seventh inductor is in the second wiring line layer.

15. The radio-frequency module according to claim 1, wherein a combination of the first band and the second band is any one of a combination of Band 1 and Band 3, a combination of Band 66 and Band 25 or Band 70, or a combination of Band 34 and Band 39, for Long Term Evolution (LTE), and
a combination of the third band and the fourth band is any other one of the combination of Band 1 and Band 3, the combination of Band 66 and Band 25 or Band 70, or the combination of Band 34 and Band 39, for LTE.

16. The radio-frequency module according to claim 1, wherein a combination of the first band and the second band is any one of a combination of n1 and n3, a combination of n66 and n25 or n70, or a combination of n34 and n39, for fifth Generation New Radio (5G NR), and
a combination of the third band and the fourth band is any other one of the combination of n1 and n3, the combination of n66 and n25 or n70, or the combination of n34 and n39, for 5G NR.

17. The radio-frequency module according to claim 6, wherein a combination of the first band and the second band is any one of a combination of Band 1 and Band 3, a combination of Band 66 and Band 25 or Band 70, or a combination of Band 34 and Band 39, for Long Term Evolution (LTE),
a combination of the third band and the fourth band is any other one of the combination of Band 1 and Band 3, the combination of Band 66 and Band 25 or Band 70, or the combination of Band 34 and Band 39 for LTE, and
a combination of the fifth band and the sixth band is a remaining one of the combination of Band 1 and Band 3, the combination of Band 66 and Band 25 or Band 70, or the combination of Band 34 and Band 39, for LTE.

18. The radio-frequency module according to claim 6, wherein a combination of the first band and the second band is any one of a combination of n1 and n3, a combination of n66 and n25 or n70, or a combination of n34 and n39, for fifth Generation New Radio (5G NR),
a combination of the third band and the fourth band is any other one of the combination of n1 and n3, the combination of n66 and n25 or n70, or the combination of n34 and n39, for 5G NR, and
a combination of the fifth band and the sixth band is a remaining one of the combination of n1 and n3, the combination of n66 and n25 or n70, or the combination of n34 and n39, for 5G NR.

* * * * *